US012734878B2

(12) United States Patent
Lutz et al.

(10) Patent No.: US 12,734,878 B2
(45) Date of Patent: Sep. 15, 2026

(54) APPARATUSES AND METHODS FOR LIQUID COOLING A VEHICLE SUSPENSION COMPONENT AND WHEEL CONTROLLER

(71) Applicant: HL MANDO CORPORATION, Gyeonggi-do (KR)

(72) Inventors: Chris Lutz, Bay City, MI (US); Mohammad Islam, Bay City, MI (US); Jeremy Dobbs, Bay City, MI (US); Tomy Sebastian, Bay City, MI (US); Christian Ross, Bay City, MI (US); Md Sariful Islam, Bay City, MI (US)

(73) Assignee: HL MANDO CORPORATION, Gyeonggi-Do (KR)

( * ) Notice: Subject to any disclaimer, the term of this patent is extended or adjusted under 35 U.S.C. 154(b) by 359 days.

(21) Appl. No.: 18/611,659

(22) Filed: Mar. 20, 2024

(65) Prior Publication Data

US 2025/0296428 A1 Sep. 25, 2025

(51) Int. Cl.
*B60K 11/04* (2006.01)
*B60K 7/00* (2006.01)
(Continued)

(52) U.S. Cl.
CPC ............ *B60K 11/04* (2013.01); *B60L 15/007* (2013.01); *H05K 7/20236* (2013.01);
(Continued)

(58) Field of Classification Search
CPC ..... B60K 11/04; B60K 7/0007; B60L 15/007; H05K 7/20236; H05K 7/20409; H05K 7/20927
See application file for complete search history.

(56) References Cited

U.S. PATENT DOCUMENTS 10,328,760 B2 * 6/2019 Arndt Dr habil .... B60G 21/051
11,431,228 B2 * 8/2022 Islam ..................... H02K 7/006
(Continued)

FOREIGN PATENT DOCUMENTS

KR 10-2013-0131603 12/2013
KR 20250141587 A * 9/2025 ............ B60K 11/02
(Continued)

*Primary Examiner* — Jacob B Meyer
(74) *Attorney, Agent, or Firm* — WOMBLE BOND DICKINSON (US) LLP

(57) ABSTRACT

Embodiments of the present disclosure include apparatuses and methods for mounting an electronic component, including an integrated circuit that generates heat during operation, to a component of a vehicle suspension system, such as a suspension knuckle. Some embodiments include mounting the electronic component inside a cavity that contains coolant. In some embodiments the electronic component is immersed in liquid coolant that absorbs heat from the electronic component and transfers the heat to the suspension component where the heat can be transferred to the external environment. In some embodiments the liquid coolant transitions to a gas and/or vapor, and can condense back to a liquid after transferring heat to the suspension component. In some embodiments the electronic component is connected to a heat sink, such as by soldering, and the heat sink can include cooling fins that are immersed in the coolant.

20 Claims, 14 Drawing Sheets

(51) Int. Cl.
*B60L 15/00* (2006.01)
*H05K 7/20* (2006.01)

(52) U.S. Cl.
CPC ..... *H05K 7/20409* (2013.01); *H05K 7/20927* (2013.01); *B60K 7/0007* (2013.01)

(56) References Cited

U.S. PATENT DOCUMENTS

| | | | | | |
|---|---|---|---|---|---|
| 12,206,319 | B2 * | 1/2025 | Islam | ..................... | G01D 5/145 |
| 2018/0331601 | A1 * | 11/2018 | Zhou | ........................ | H02K 9/06 |
| 2019/0319551 | A1 * | 10/2019 | Song | ..................... | H02M 7/003 |
| 2021/0281149 | A1 * | 9/2021 | Islam | ................... | G01D 11/245 |
| 2023/0327511 | A1 * | 10/2023 | Miyazono | ................ | B60K 1/00 |
| 2025/0296424 | A1 * | 9/2025 | Lutz | ..................... | B60K 7/0007 |
| 2025/0296427 | A1 * | 9/2025 | Lutz | ................... | H05K 7/20936 |
| 2025/0296428 | A1 * | 9/2025 | Lutz | ....................... | B60K 11/04 |
| 2025/0299974 | A1 * | 9/2025 | Lutz | .................... | B60R 16/0231 |

FOREIGN PATENT DOCUMENTS

| | | | | | |
|---|---|---|---|---|---|
| KR | 20250141588 | A * | 9/2025 | ......... | H05K 7/20409 |
| KR | 20250141589 | A * | 9/2025 | ........... | B60K 7/0007 |
| KR | 20250141590 | A * | 9/2025 | .......... | H10W 70/461 |

* cited by examiner

APPARATUSES AND METHODS FOR LIQUID COOLING A VEHICLE SUSPENSION COMPONENT AND WHEEL CONTROLLER

FIELD

Embodiments of the present disclosure relate to the automotive industry, and to a cooling system for vehicle electronics.

BACKGROUND

Integrated circuits frequently generate heat during operation and require cooling. Power inverters, including those used in electric vehicles, are example integrated circuits where cooling is frequently required to prevent the power inverters from overheating.

Electric vehicles are one example implementation where integrated circuits used in the electric vehicles can require cooling. Electric vehicles utilize electric power as at least one power source for increasing, and optionally decreasing, the rotational speed of the vehicle's wheels. Electric vehicles include purely electric vehicles that solely use electric power for increasing/decreasing the rotational speed of the vehicle's wheels and hybrid vehicles that use a different source of power (typically fossil fuel) in addition to electric power for increasing/decreasing the rotational speed of the vehicle's wheels.

One or more controllers, which are also referred to as electronic control units (ECUs), can be used to control the functionality within the electric vehicles, such as to control the power applied to the vehicle's wheels during movement, the power extracted from the vehicle's wheels during deceleration, the functioning of the in-cabin systems, and to control the functioning of the main motor(s). Many electronic vehicle controllers require specific temperatures for operations. If the electronic vehicle controllers becomes too hot, the electronic vehicle controllers can malfunction. Electronic vehicle controllers typically include fans to help cool the controllers. Electronic vehicle controllers, and in particular circuitry that generates a significant amount of heat (for example, inverters), are also typically positioned in locations that are central to the vehicle, such as in or around the main motor compartment.

It was realized by the inventors of the current disclosure that problems exist with cooling integrated circuits, such as electronic vehicle controllers, with centrally locating vehicle controllers, and with remotely locating high heat generating portions of vehicle controllers (for example, inverters including wheel control power inverters that control the operation of a wheel assembly for an electrically powered vehicle), such as in and around the regions near the rotating wheels, and that improvements in electronic vehicle controllers and improvements in systems and methods for cooling electronic vehicle controllers are needed. It was also realized by the inventors of the current disclosure that problems exist with mounting components (for example, thermal regulators, such as cooling fins and/or heat sinks) to integrated circuits to, for example, assist integrated circuits in dissipating heat.

Certain preferred features of the present disclosure address these and other needs and provide other important advantages.

SUMMARY

Embodiments of the present disclosure provide improved apparatuses and methods for liquid cooling a vehicle suspension component and wheel controller.

Embodiments of the present disclosure mount a wheel controller that controls the operation of an electric vehicle's wheel assembly to a portion of the vehicle's suspension system near the wheel assembly. In some embodiments the wheel controller is integrated into a portion of the vehicle's suspension system, such as being integrated into the suspension knuckle, which can be a structural and/or load bearing component of the vehicle's suspension system. In other embodiments the wheel controller is attached to a portion of the vehicle's suspension system, such as being attached to the suspension knuckle. While locating the wheel controller near the wheel assembly has advantages, there are drawbacks such as difficulties in cooling the wheel controller when the wheel controller is remotely located away from a centralized cooling system. However, embodiments of the present disclosure utilize immersion cooling (also referred to as passive liquid cooling), such as single-phase or two-phase immersion cooling, to cool the wheel controller. Example embodiments immerse an integrated circuit (and/or an attached heat sink if used) in liquid coolant, and can heat the liquid coolant to temperatures sufficient to transition the liquid coolant to a gas and/or vapor. The coolant transfers heat to the housing of the wheel controller, which in turn transfers heat to the surrounding environment. In some embodiments the gas and/or vapor coolant condenses when transferring heat to the housing and migrates back to the pool of liquid coolant, in which the integrated circuit may be immersed.

Embodiments provide advantages over existing wheel controllers since, for example, the wheel controller may be located in a region where there is insufficient airflow for traditional air cooling, such as locations away from the primary vehicle cooling system of the vehicle including locations around the perimeter of the vehicle, such as in and around the wheel wells or other remote locations.

Embodiments of the present disclosure include systems and methods for mounting components to integrated circuits, such heat sinks, which may be finned. Some embodiments utilize directed laser heating to heat a bonding material (for example, solder) and the surfaces of the integrated circuit and the component being mounted. The materials may be heated to a temperature sufficient to form a bond (for example, an intermetallic bond) between the integrated circuit and the bonding material, and between the component being mounted and the bonding material, without damaging the integrated circuit or the component. Embodiments include a heat sink with a base and cooling fins extending from the base, and the laser can be directed at the base and between the cooling fins to heat the base without damaging the cooling fins.

Embodiments of the present disclosure are capable of combining one or more vehicle components that are traditionally separate (such as a structural component, an electronic enclosure and/or heat dissipating component) into a single vehicle component.

In accordance with aspects of embodiments of the present disclosure, an apparatus for a vehicle is disclose. Embodiments of the apparatus include: a vehicle suspension member defining a fluid tight cavity and a coolant port, the vehicle suspension member forming a load bearing component of a suspension system that connects a vehicle body to one or more wheels, the fluid tight cavity configured to hold coolant and defining an interior surface, and the coolant port configured to permit movement of coolant through the coolant port when unsealed and configured to inhibit movement of coolant through the coolant port when sealed; and a heat generating member mounted within the fluid tight cavity, wherein during operation the heat generating member is submerged in liquid coolant held within the fluid tight cavity, the heat generating member raises the temperature of the liquid coolant until at least some of the liquid coolant transitions to a vapor and/or a gas, the vapor and/or gas coolant condenses on the interior surface of the fluid tight cavity, and the condensed coolant collects in the fluid tight cavity adjacent to the heat generating member. Additional embodiments can include a wheel connection member including a wheel hub or a wheel spindle and/or a suspension system connection member configured to attach to a vehicle suspension system. Further embodiments can include the suspension member including an exterior surface defining one or more cooling fins, the heat generating member being an electrical circuit, the electrical circuit including at least one power inverter and/or the power inverter being configured to power an electric wheel assembly of an electric vehicle. Yet further embodiments can include a heat conducting boiler thermally connected to the electrical circuit and defining one or more cooling fins, the heat conducting boiler being electrically connected to the electrical circuit, the electrical circuit being connected to a printed circuit board mounted within the fluid tight cavity, the electrical circuit being connected to the suspension member, the fluid tight cavity holding liquid dielectric coolant and/or the heat generating member being submerged in the liquid dielectric coolant.

In accordance with aspects of embodiments of the present disclosure, a wheel controller for an electric vehicle including a vehicle suspension system is disclosed. In embodiment the wheel controller can include: a suspension knuckle defining a first mounting location and a second mounting location, the first mounting location configured to mount to an electric wheel assembly and the second mounting location configured to mount to a vehicle suspension system, wherein the suspension knuckle forms a structural part of the vehicle suspension system when the first mounting location is mounted to an electric wheel assembly and the second mounting location is mounted to the vehicle suspension system; a cover connected to the suspension knuckle, wherein the cover and suspension knuckle define a fluid tight cavity when the cover and the suspension knuckle are connected to one another, the fluid tight cavity defining a fluid collection region in which coolant is held, wherein the fluid tight cavity is configured to hold coolant within the fluid tight cavity when the coolant is heated; and/or wheel control circuitry configured to control the functioning of an electric wheel assembly to which the suspension knuckle is attached, the wheel control circuitry including one or more heat generating components that generate heat while operating, wherein the one or more heat generating components are positioned within the fluid collection region of the fluid tight cavity. Additional embodiments can include the fluid tight cavity including an upper portion above the fluid collection region, wherein during operation the coolant that is heated by the one or more heat generating components into a gas and/or vapor condenses to liquid form on the surfaces of the upper portion and moves in liquid form to the fluid collection region. Further embodiments can include the upper portion defining an upper portion volume and the fluid collection region defining a fluid collection region volume, the upper portion volume being greater than the fluid collection region volume. Still further embodiments can include the upper portion of the fluid tight cavity defining an upper portion depth between the suspension knuckle and the cover, the fluid collection region of the fluid tight cavity defining a fluid collection region depth between the suspension knuckle and the cover, and the upper portion depth is equal to the fluid collection region depth, and the upper portion of the fluid tight cavity defining an upper portion width perpendicular to the upper portion depth, the fluid collection region of the fluid tight cavity defining a fluid collection region width, and the upper portion width being greater than the fluid collection region width. Still additional embodiments can include the condensed coolant moving by gravity from the upper portion of the fluid tight cavity to the fluid collection region, the suspension knuckle defining a plurality of cooling fins located on the external surface of the suspension knuckle, the cover defining a plurality of cooling fins located on the external surface of the cover and/or the suspension knuckle defining a plurality of cooling fins located on the external surface of the suspension knuckle. Yet additional embodiments include an electric vehicle that includes the wheel controller of one or more of the embodiments described in this paragraph.

In accordance with aspects of embodiments of the present disclosure, a method of manufacturing a wheel controller for an electric vehicle is disclosed. Embodiments of the method include: obtaining a wheel control circuit board, the wheel control circuit board configured to control the functioning of an electric vehicle wheel assembly, the wheel control circuit board including one or more heat generating components; obtaining a cover shaped to form a first portion of a fluid tight cavity; obtaining a suspension knuckle shaped to form a second portion of a fluid tight cavity, the suspension knuckle including one or more connection members configured to connect the suspension knuckle to an electric vehicle suspension system; and forming a fluid tight cavity with the wheel control circuit board located within the fluid tight cavity by connecting the cover to the suspension knuckle, the fluid tight cavity including an upper portion and a lower fluid collection portion, wherein the one or more heat generating components of the wheel control circuit board are positioned in the lower fluid collection portion of the fluid tight cavity. Additional embodiments can include connecting an electrical power source to the wheel control circuit after said forming of the fluid tight cavity, connecting the wheel control circuit board to the cover before said forming a fluid tight cavity, adding liquid coolant to the fluid tight cavity and/or connecting the suspension knuckle to the vehicle suspension system of the electric vehicle with the suspension knuckle performing load carrying functions in the suspension system of the electric vehicle. Further embodiments can include forming an electric vehicle including connecting the suspension knuckle to the vehicle suspension system of the electric vehicle with the suspension knuckle performing load carrying functions in the suspension system of the electric vehicle.

In accordance with aspects of embodiments of the present disclosure, a wheel controller for an electric vehicle that includes a vehicle suspension system is disclosed. Embodiments can include: a suspension knuckle defining a first mounting location and a second mounting location, the first mounting location configured to mount to an electric wheel assembly and the second mounting location configured to mount to a vehicle suspension system, wherein the suspension knuckle forms part of the vehicle suspension system when the first mounting location is mounted to an electric wheel assembly and the second mounting location is mounted to the vehicle suspension system; a cover connected to the suspension knuckle; wheel control circuitry connected to the suspension knuckle and configured to control the functioning of an electric wheel assembly to which the suspension knuckle is attached, the wheel control circuitry including heat generating components that generate heat while operating; and/or means for cooling the heat generating components. Additional embodiments can include said means for cooling including a fluid tight cavity between the cover and the suspension knuckle, the fluid tight cavity defining a fluid collection region in which coolant is held and the heat generating components are positioned in the fluid collection region. Still further embodiments can include dielectric coolant contained within the fluid collection region of the fluid tight cavity, the dielectric coolant changing from liquid to gas and/or vapor and moving from the fluid collection region to an upper portion of the fluid tight cavity when heated by the heat generating components and/or the dielectric coolant changing from gas and/or vapor to liquid and moving from the upper portion of the fluid tight cavity to the fluid collection region when cooled by the portions of the suspension knuckle and the cover defining the fluid tight cavity.

This summary is provided to introduce a selection of the concepts that are described in further detail in the detailed description and drawings contained herein. This summary is not intended to identify any primary or essential features of the claimed subject matter. Some or all of the described features may be present in the corresponding independent or dependent claims, but should not be construed to be a limitation unless expressly recited in a particular claim. Each embodiment described herein does not necessarily address every object described herein, and each embodiment does not necessarily include each feature described. Other forms, embodiments, objects, advantages, benefits, features, and aspects of the present disclosure will become apparent to one of skill in the art from the detailed description and drawings contained herein. Moreover, the various apparatuses and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

BRIEF DESCRIPTION OF THE DRAWINGS

Some of the figures shown herein may include dimensions or may have been created from scaled drawings. However, such dimensions, or the relative scaling within a figure, are by way of example, and not to be construed as limiting.

DETAILED DESCRIPTION OF THE ILLUSTRATED EMBODIMENTS

Figure 1:
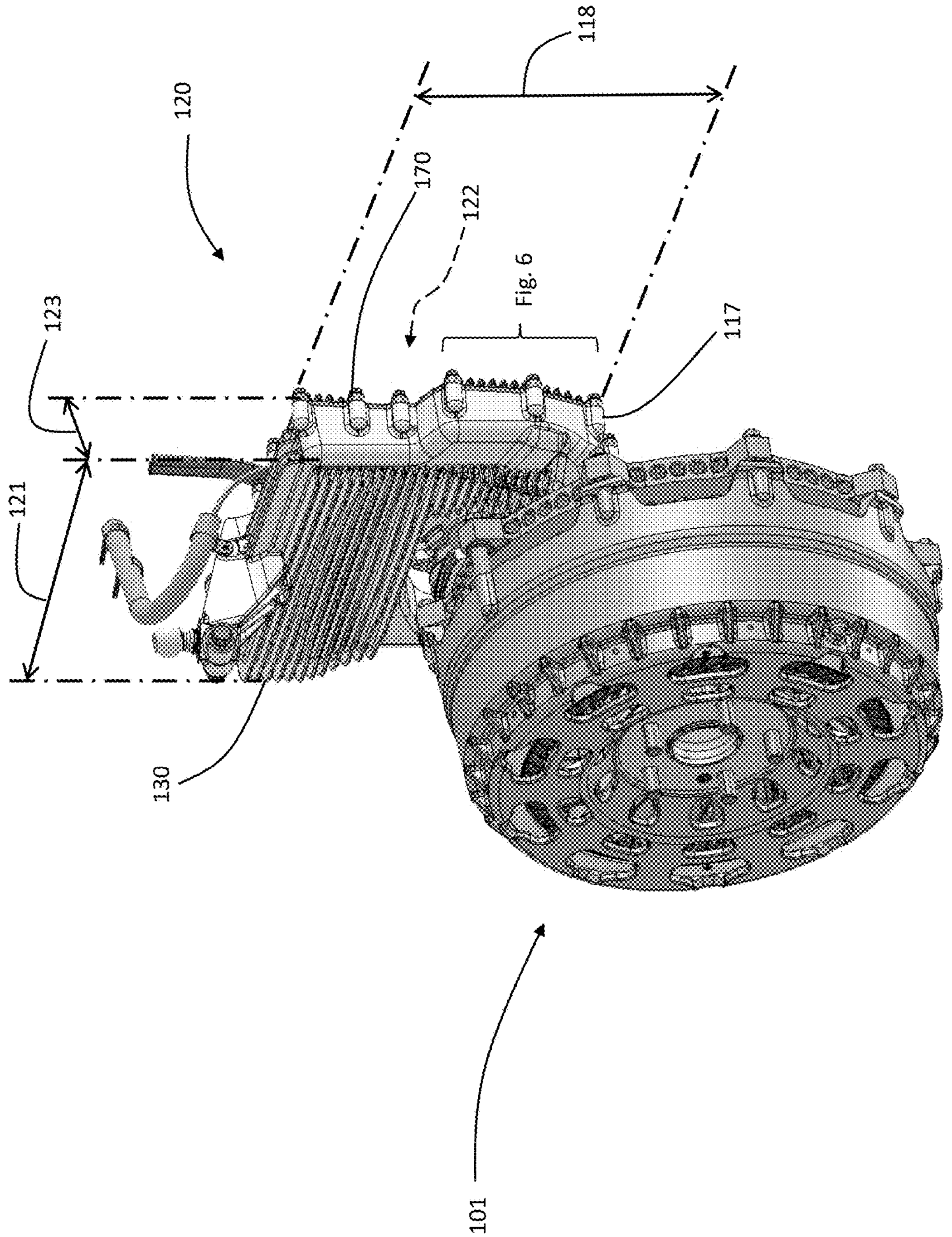
FIG. 1 is a perspective view of a wheel controller mounted to a wheel assembly according to at least one embodiment of the present disclosure.

For the purposes of promoting an understanding of the principles of the disclosure, reference will now be made to one or more embodiments, which may or may not be illustrated in the drawings, and specific language will be used to describe the same. It will nevertheless be understood that no limitation of the scope of the disclosure is thereby intended; any alterations and further modifications of the described or illustrated embodiments, and any further applications of the principles of the disclosure as illustrated herein are contemplated as would normally occur to one skilled in the art to which the disclosure relates. At least one embodiment of the disclosure is shown in great detail, although it will be apparent to those skilled in the relevant art that some features or some combinations of features may not be shown for the sake of clarity.

Any reference to "invention" that may occur within this document is a reference to an embodiment of a family of inventions, with no single embodiment including features that are necessarily included in all embodiments, unless otherwise stated. Furthermore, although there may be references to benefits or advantages provided by some embodiments, other embodiments may not include those same benefits or advantages, or may include different benefits or advantages. Any benefits or advantages described herein are not to be construed as limiting to any of the claims.

Likewise, there may be discussion with regards to "objects" associated with some embodiments of the present invention, it is understood that yet other embodiments may not be associated with those same objects, or may include yet different objects. Any advantages, objects, or similar words used herein are not to be construed as limiting to any of the claims. The usage of words indicating preference, such as "preferably," refers to features and aspects that are present in at least one embodiment, but which are optional for some embodiments.

Specific quantities (spatial dimensions, temperatures, pressures, times, force, resistance, current, voltage, concentrations, wavelengths, frequencies, heat transfer coefficients, dimensionless parameters, etc.) may be used explicitly or implicitly herein, such specific quantities are presented as examples only and are approximate values unless otherwise indicated. Discussions pertaining to specific compositions of matter, if present, are presented as examples only and do not limit the applicability of other compositions of matter, especially other compositions of matter with similar properties, unless otherwise indicated.

Embodiments of the present disclosure include a controller for an electrically powered and electrically controlled vehicle wheel assembly that provides power to, and in some embodiments can absorb power from, a wheel of an electric vehicle. Embodiments of the controller are located near the wheel assembly in contrast to being centrally located, which may be adjacent to or integrated with other vehicle electronics and may be located near the vehicle power source, such as the vehicle batteries. Further embodiments are incorporated into a component of the vehicle suspension, such as a suspension knuckle, and still further embodiments are attached to a component/member of the vehicle suspension, such as a suspension knuckle. Additional embodiments locate the electronic components of the wheel controller in a fluid tight cavity that is at least partially filled with liquid coolant and immersing at least some of the electronic components, such as the electronic components that generate heat, in a pool of liquid coolant. In some embodiments the coolant converts to a gas and/or a vapor when heated by the electronic components, migrates to a portion of the cavity that is not covered in liquid coolant, cools on the interior surfaces of the cavity condensing back to liquid form, and migrates in liquid form back to the pool of liquid coolant. In further embodiments the coolant remains primarily in a liquid state when heated by the electronic components and transfers heat to portions of the liquid away from the electronic components (such as by conduction and/or circulation) and cools on the interior surfaces of the cavity (for example, interior surfaces 138 and 178). In some embodiments the cavity can include one or more passageways (for example, piping or an aperture in a common wall between two cavities) and/or one or more additional cavities connected to a principal cavity (such as by one or more passageways). In some embodiments the cavity can include a component that is or resembles a traditional radiator.

Some embodiments include electronic components that are thermally connected to boilers, which may include multiple fins, and in some embodiments the thermal connection is also an electrical connection.

Depicted in FIGS. 1-5 and 20 is a wheel controller 120 and a wheel assembly 101 according to at least one embodiment of the present disclosure. The wheel assembly 101 powers the rim 104 and tire 103 that are connected to the wheel assembly 101 so that the vehicle can accelerate and/or decelerate. In electric vehicles the wheel assembly 101 is electrically powered and electrically controlled, with the wheel controller 120 controlling the wheel assembly 101.

The wheel controller 120 can be located near the wheel assembly 101 and may be connected to a part of a vehicle suspension system that connects one or more wheels to a vehicle body. In at least one embodiment the wheel controller 120 is connected to a vehicle suspension member (which may also be referred to as a vehicle suspension component) that forms a functional part of the vehicle suspension system, such as a suspension knuckle. However, in some embodiments the wheel controller 120 itself forms a functional part of the vehicle suspension system, and in some embodiments the wheel controller 120 forms a load bearing member (a member that carries structural loads) that can perform a functional part of the vehicle suspension system. Components that form a functional part of the vehicle suspension system are components that, if removed (or damaged), result in the suspension system operating improperly or being unable to operate. For example, in most vehicle suspension systems the suspension knuckle (which is typically also a load bearing member) and would need to be replaced if the suspension knuckle were damaged or removed from the suspension system. Similarly, a lower control arm would need to be replaced by another lower control arm if the lower control arm were removed from the suspension system or damaged. However, a placard attached to a steering knuckle (or a lower control) arm and signifying that the component meets certain standards would not need to be replaced if the placard were damaged or removed from the steering knuckle (or lower control arm).

In some embodiments the wheel controller 120 includes a housing 117, which can include two components, such as a suspension knuckle (for example, suspension knuckle 130) and a wheel controller cover (for example, wheel controller cover 170), that together form a cavity within the wheel controller (for example, cavity 122). In some embodiments the housing is implemented as a single-piece component (for example, a component of unitary construction) with a cavity, one or more apertures (one example being aperture 179) allowing access to the cavity, and one or more closures (for example, plugs, caps, lids or assemblies) that seals the one or more apertures.

In FIGS. 1-5 the wheel controller 120 includes a vehicle suspension member that forms a load bearing portion of the vehicle suspension system, which in this example is a suspension knuckle 130. In at least one embodiment, the load bearing vehicle suspension member is of unitary construction, which is constructed of a single piece of material. The suspension knuckle 130 includes a wheel connection member (a component for connecting the suspension knuckle to a wheel assembly or a wheel), such as a wheel hub 131 (see, FIG. 3A) or a spindle 133 (see, FIG. 3B), and a suspension system connection member (a component for connecting the suspension knuckle to another part of the vehicle, such as another part of the vehicle suspension system or a part of the vehicle chassis), such as the ball joint 136. The wheel controller 120 also includes a wheel controller cover 170 that is mounted to the suspension member/knuckle 130. When mounted to one another, the suspension knuckle 130 and the wheel controller cover 170 create a wheel controller cavity 122, which may be fluid tight and which may hold or contain liquid coolant. In the embodiment depicted in FIG. 1 the wheel controller cavity 122 is located between the wheel controller cover 170 and is depicted with a dashed lead arrow to indicate that the wheel controller cavity is hidden from view in FIG. 1. Also depicted in FIG. 1 are the height 118 of the wheel controller cavity 122, the width 121 of the wheel controller cavity 122, and the depth 123 of the wheel controller cavity 122.

The suspension knuckle 130 forms a structural and load bearing component of the vehicle's suspension system performing load carrying functions of the suspension system. For example, in at least the embodiments depicted in FIGS. 1-5 the suspension knuckle 130 is load bearing member, which indicates that the suspension knuckle 130 is designed to carry the structural loads of the vehicle's weight that are supported by the wheel (which may include, for example, wheel assembly 101, tire 103 and/or rim 104) that is connected to the suspension knuckle 130. As another example, in some embodiments (including those depicted in FIGS. 1-5) the suspension knuckle 130 is designed to carry the structural loads of the steering mechanism to steer the tire 103 in different directions and provide the driver with the ability to control the direction of the vehicle.

Figure 2:
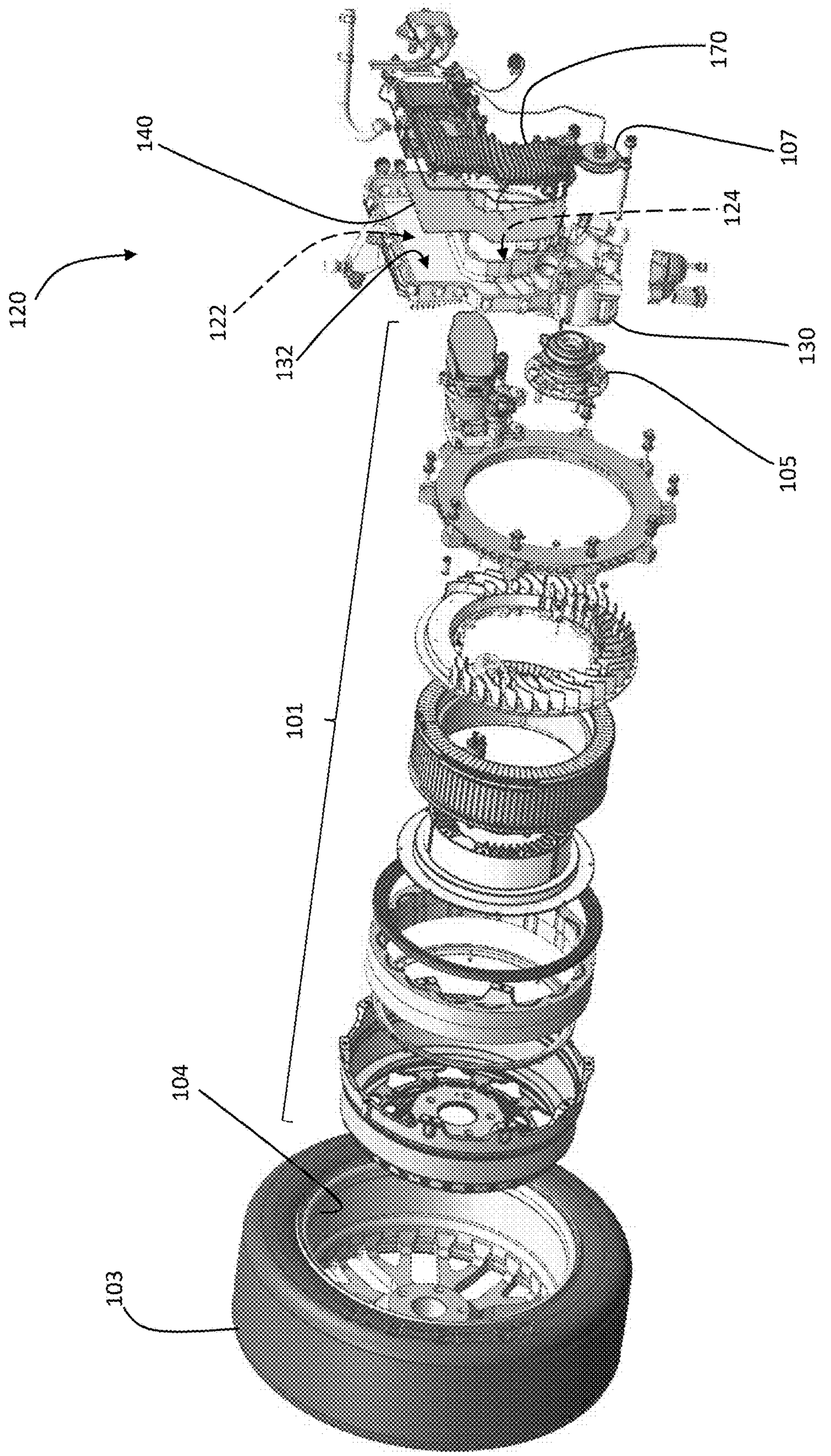
FIG. 2 is an exploded perspective view of the wheel controller and the wheel assembly of FIG. 1 aligned with a tire and rim.

Depicted in FIG. 2 is an exploded view of the wheel controller 120 and the wheel assembly 101 depicted in FIG. 1 aligned with a tire 103 and rim 104. Components of the wheel controller 120 visible in FIG. 2 include a suspension knuckle 130, electronic wheel control circuitry 140 (which may be in the form of a printed circuit board (PCB) as depicted in FIG. 2), and a wheel controller cover 170. The wheel controller cavity 122 is formed when the suspension knuckle 130 and the wheel controller cover 170 are connected to one another. The wheel control circuitry 140 is positioned to be within the wheel controller cavity 122 when the suspension knuckle 130 and the wheel controller cover 170 are connected to one another. The suspension knuckle 130 includes an optional hollow 132 that can form at least part of the wheel controller cavity 122. The lower part of the wheel controller cavity 122 is a fluid collection region (reservoir) 124 in which liquid coolant 115 collects during operation. The wheel controller cavity 122 and the fluid collection region 124 are generally indicated with dashed lines to indicate that they are formed when the suspension knuckle 130 and the wheel controller cover 170 are connected to one another. In some embodiments the wheel controller cover 170 can include an optional hollow, either in addition to or in lieu of the optional hollow 132 of suspension knuckle 130, that can form at least part of the cavity 132.

Details of the wheel assembly 101 can also be seen in FIG. 2, such as a wheel bearing 105, and a motor position sensor assembly 107 is also depicted.

Figures 3A, 3B:
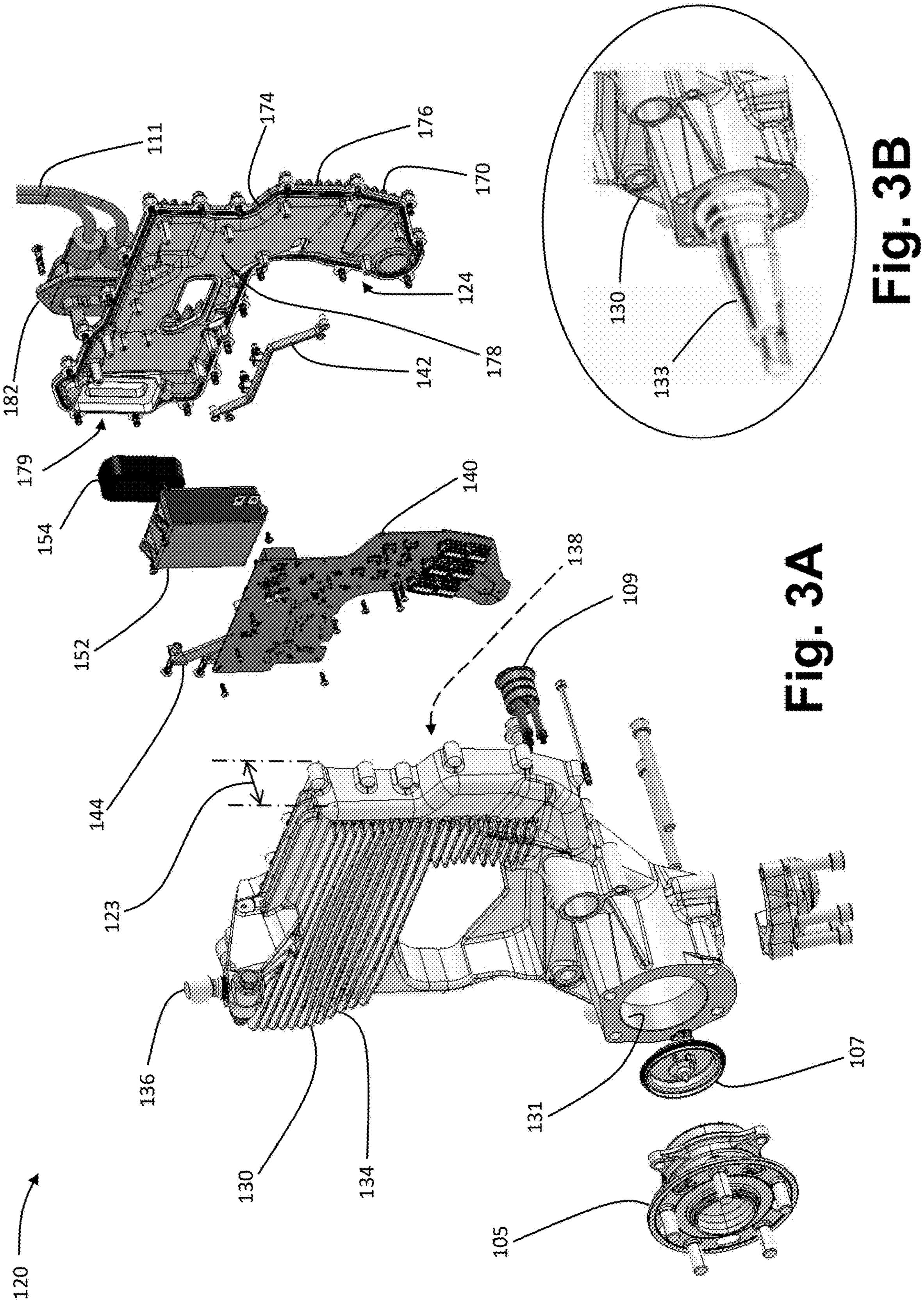
FIG. 3A is an exploded perspective view of the wheel controller and some components of the wheel assembly depicted in FIG. 1.
FIG. 3B is a perspective view of a wheel controller with a spindle according to at least one embodiment of the present disclosure.

FIG. 3A is an expanded view of the wheel controller 120 depicting additional components of the suspension knuckle 130, such as the optional cooling fins 134 located on an external surface of the suspension knuckle 130 (the internal surface of the suspension knuckle 130 being the surface of suspension knuckle 130 that forms part of the wheel controller cavity 122) and an optional ball joint 136 to which components of the steering assembly may be connected. Optional cooling fins 176 may also be located on the external surface of the wheel controller cover 170 (the internal surface of the cover 170 being the surface of cover 170 that forms part of the wheel controller cavity 122).

FIG. 3A also depicts the depth 123 of the wheel controller cavity 122, which is the depth of the wheel controller cavity from the wall of the wheel controller cavity formed by the suspension knuckle 130 and the opposing wall of the cover 170 when the suspension knuckle 130 and the cover 170 are connected together. In the illustrated embodiment the depth 123 of the wheel controller cavity 122 is generally constant throughout the wheel controller 120, although in alternate embodiments the depth of the wheel controller cavity can vary, such as to increase or decrease the volume of the lower portion 127 of the wheel controller cavity 122 where the liquid coolant collects, which can affect the amount of coolant required to submerge the heat generating members.

Decreasing the volume of the lower portion 127 of the wheel controller cavity 122 can also affect the amount of cooling that occurs for a given volume of coolant 115. For example, decreasing the depth 123 of the wheel controller cavity 122 decreases the volume of the lower portion 127 of the wheel controller cavity 122 and the amount of coolant 115 required to submerge the heat generating circuitry 146 without significantly decreasing the total surface area of the interior of the coolant cavity where heat is transferred from the coolant 115 to the wheel controller housing 117 (which includes the suspension knuckle 120 and the wheel controller cover 170 in the embodiment illustrated in FIGS. 1-5) resulting in a smaller amount of coolant 115 being able to transfer heat to an interior surface area that has not significantly decreased.

FIG. 3A further depicts an optional high voltage pass-through assembly 182 that supplies electrical power to the wheel controller 120. The high voltage pass-through assembly 182 facilitates delivery of electrical power while maintaining the fluid tight environment within the wheel controller 120 during operation. A gasket 174 may be included to help ensure a fluid tight seal between the suspension knuckle 130 and the wheel controller cover 170. Also depicted are an optional motor interconnect assembly 109, power cords 111, an optional wheel control circuitry bus bar 142, an optional battery bus bar 144, an optional capacitor 152, an optional electrical filter 154 (which may be a common mode choke).

Depicted in FIG. 3B is a partial perspective view of an example vehicle suspension member/component of the suspension system (for example, knuckle 130) with a wheel connection member in the form of a spindle 133 (instead of the hub 131 as depicted in FIG. 3A) according to at least one embodiment of the present disclosure.

Figure 4:
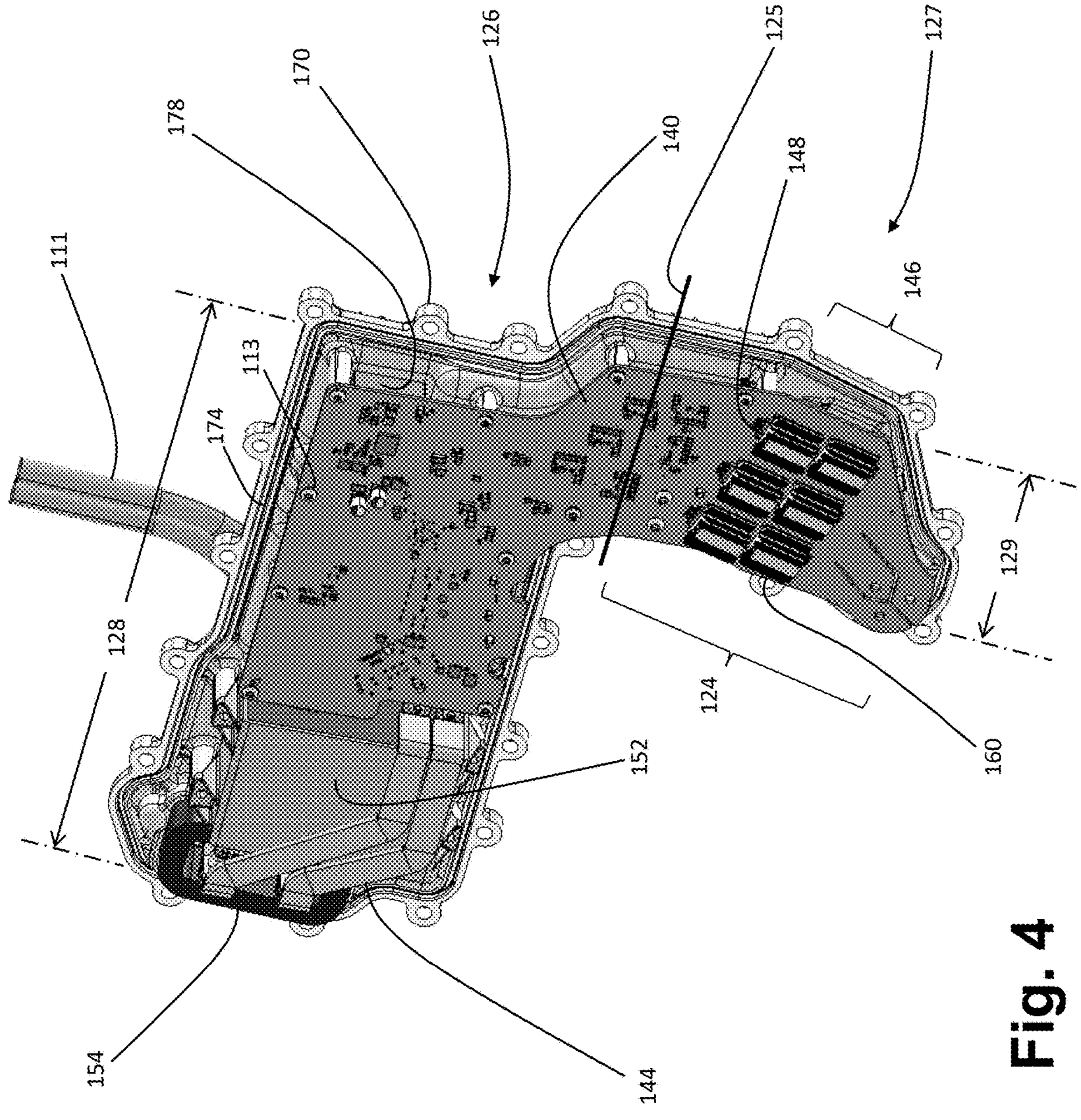
FIG. 4 is a perspective view of the wheel control circuitry and the wheel controller cover of the wheel controller depicted in FIG. 3A.

FIG. 4 depicts a further expanded view of the wheel control circuitry 140 and the wheel controller cover 170. The wheel control circuitry 140 is connected to the wheel controller cover 170 fasteners 113. Embodiments where the wheel control circuitry 140 is connected directly to the wheel controller cover 170 (for example, the wheel control circuitry 140 physically contacts the wheel control cover 170 or the wheel control circuitry 140 contacts the wheel control cover 170 via fasteners (e.g., clips, screws, rivets, brackets, adhesive, etc.) whose primary function is to connect the wheel control circuitry 140 to the wheel control cover 170) as depicted in FIG. 4 have advantages during assembly of the wheel controller 120 in that all components of the wheel controller 120 except the suspension knuckle 130 may be assembled together prior to a final step of fastening the components to the steering assembly. These embodiments also have maintenance related advantages since it is possible to remove the components of the wheel controller 120 from the suspension knuckle 130 while leaving the suspension knuckle 130 attached to the vehicle (for example, the vehicle's steering assembly and wheel assembly 101) with the suspension knuckle continuing to carry its structural loads eliminating the need to have external supports and simplifying repairs.

The coolant collection region 124 is located at the bottom of the wheel controller cavity 122, which in the illustrated embodiments is at the lowest portions of the wheel control circuitry 140 and the wheel controller cover 170. One or more heat generating members/features of the wheel control circuitry 140 (depicted as heat generating circuitry 146) are located in the coolant collection region 124. In the illustrated embodiment the heat generating circuitry includes a six (6) integrated controllers (IC) 148, which may be, for example, field effect transistor (FET) inductors, which in some embodiments are power inverters that change direct electrical current (such as from an automobile battery) to alternating current (such as to power a wheel assembly) and typically generate more heat than the other components on the wheel control circuitry 140. The heat generating circuitry 146 typically does not tolerate high heat conditions (as an example, temperatures in excess of 175° C. to 200° C. can reduce the reliability of, deform and/or otherwise harm the heat generating circuitry 146) and is typically some of the higher cost components in a wheel controller. The heat generating circuitry 146 acts as a heater to heat the liquid coolant 115 that has collected in the coolant collection region 124. The heat generating circuitry 146 can include boilers 160 that are thermally attached to the integrated circuits that generate heat. By removing more heat from the heat generating circuitry 146, higher currents can be used decreasing the total number of components in the heat generating circuitry 146. For example, in some embodiments the heat generating circuitry 146 includes FETs rated at 50 amps, but due to the cooling effects of the wheel controller 120 the FETs can be operated at 100 amps without overheating and thereby reducing the total number of FETs required in the wheel control circuitry.

Depicted in FIG. 4 is a liquid coolant level/line 125 separating an upper portion 126 of the wheel controller cavity 122 from a lower portion 127 of the wheel controller cavity 122. Below the liquid coolant level 125 is liquid coolant 115. The heat generating circuitry 146 is located below the liquid coolant level 125 resulting in the heat generating circuitry 146 being submerged in the liquid coolant 115. The actual location of the liquid coolant level 125 during operation is generally established by the shape and size of the wheel controller cavity 122 as well as the orientation of the wheel controller 120 when installed on a vehicle, the depicted location of liquid coolant level 125 being one example location and orientation. The location of the liquid coolant level 125 can also move somewhat during operation as the coolant 115 is heated and the portion of the coolant 115 that is in vapor and/or gaseous form increases. in embodiments where the liquid coolant 115 is not expected to transition to a vapor and/or gaseous state during operation, the liquid coolant level 125 may be higher than depicted in FIG. 4 increasing the surface area of wheel controller cavity 122 in which the coolant is in contact.

FIG. 4 also depicts the width 128 of the upper portion 126 of the wheel controller cavity 122 and the width 129 of the lower portion 127 of the wheel controller cavity 122. Widths 128 and 129 are measured in a direction that is perpendicular to the depth 123 of the wheel controller cavity 122, which is depicted in FIG. 3A. In the illustrated embodiments, the volume of the wheel controller cavity upper portion 126 is approximately equal to the product of the width 128 and the depth 123. Similarly, the volume of the wheel controller cavity lower portion 127 is approximately equal to the product of the width 129 and the depth 123 in the illustrated embodiments. In the illustrated embodiments the volume of the wheel controller cavity upper portion 126 is also greater than the volume of the wheel controller cavity lower portion 127, which can have advantages in that there is more space in which the gas and/or vapor form of coolant 115 can expand than the space for holding the liquid form of the coolant 115. In embodiments in which the coolant 115 is not expected to transition to a gas and/or vapor, the additional volume of the wheel controller cavity upper portion 126 provides additional surface area for the coolant 115 to contact and transfer heat to the environment. The vertically narrow characteristic of the lower portion 127 of the wheel controller cavity 122 with the heat generating circuitry 146 of the integrated circuitry 148 being grouped together in the smaller space (and in some embodiments toward the bottom of the lower portion 127 of the wheel controller cavity 122) enhances the ability of the coolant 115 to pool around the heat generating circuitry 146 after condensing on the interior surface 138 of suspension knuckle 130 and the interior surface 178 of wheel controller cover 170.

Figure 5:
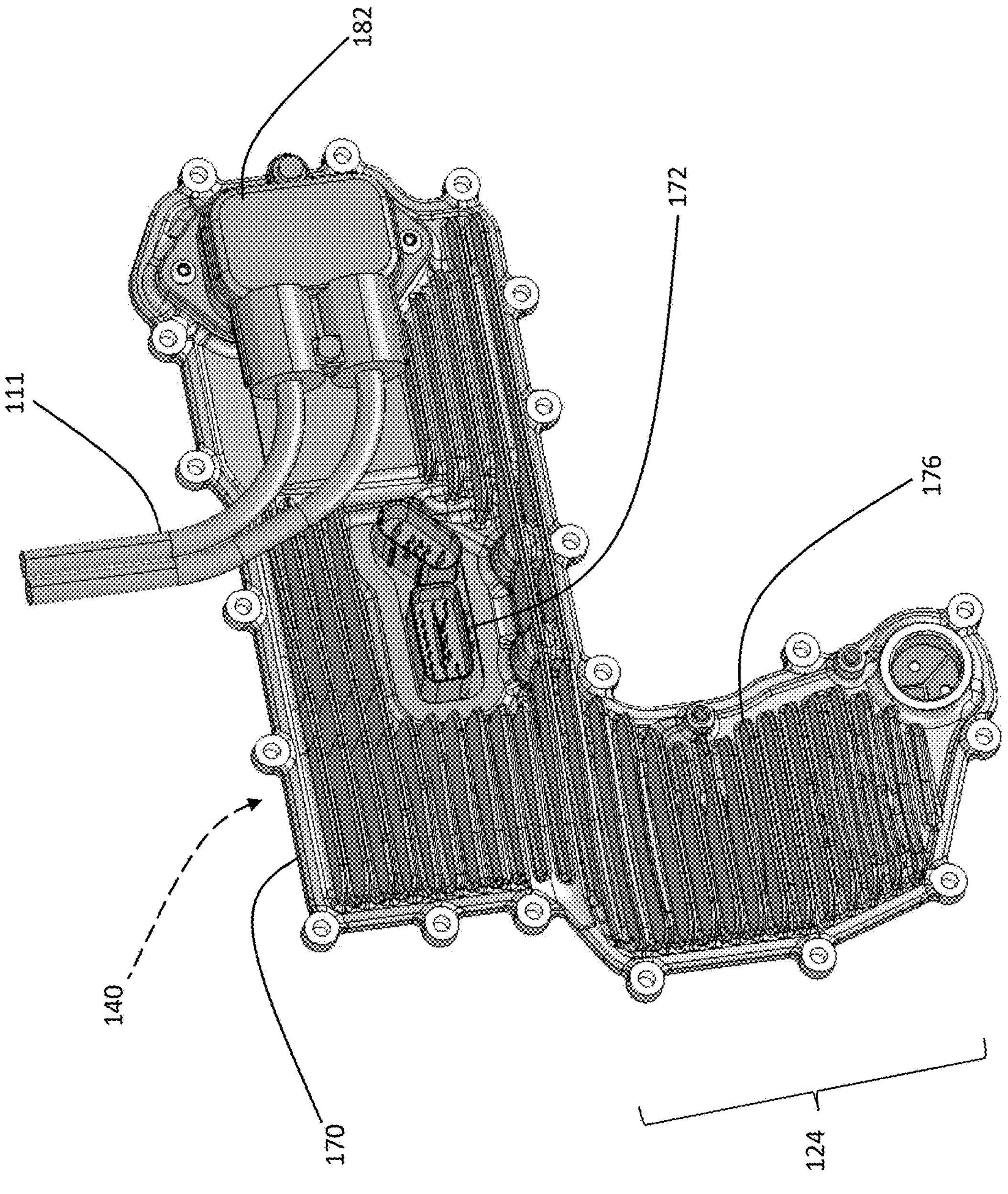
FIG. 5 is a reverse angle perspective view of the wheel control circuitry and the wheel controller cover depicted in FIG. 4.

Depicted in FIG. 5 is a reverse angle view of the wheel control circuitry 140 (depicted with a dashed line since it is hidden from view) and the wheel controller cover 170 depicted in FIG. 4. Wheel control circuitry connectors 172 (depicted as electrical headers) are used to communicate with the wheel control circuitry 140 when the wheel controller 120 is assembled and the wheel control circuitry 140 is within the wheel controller cavity 122. Views of the optional cooling fins 176 and the optional high voltage pass-through assembly 182 are provided in more detail in FIG. 5.

While the above description of the wheel controller 120 includes a component that forms a structural and load bearing part of the vehicle suspension (namely, the suspension knuckle 130), other embodiments include a wheel controller 120 that connects to one or more structural and load bearing components of the vehicle suspension located near the wheel (such as the suspension knuckle, wheel hub or wheel spindle) while the wheel controller 120 carries few if any structural loads.

Figure 6:
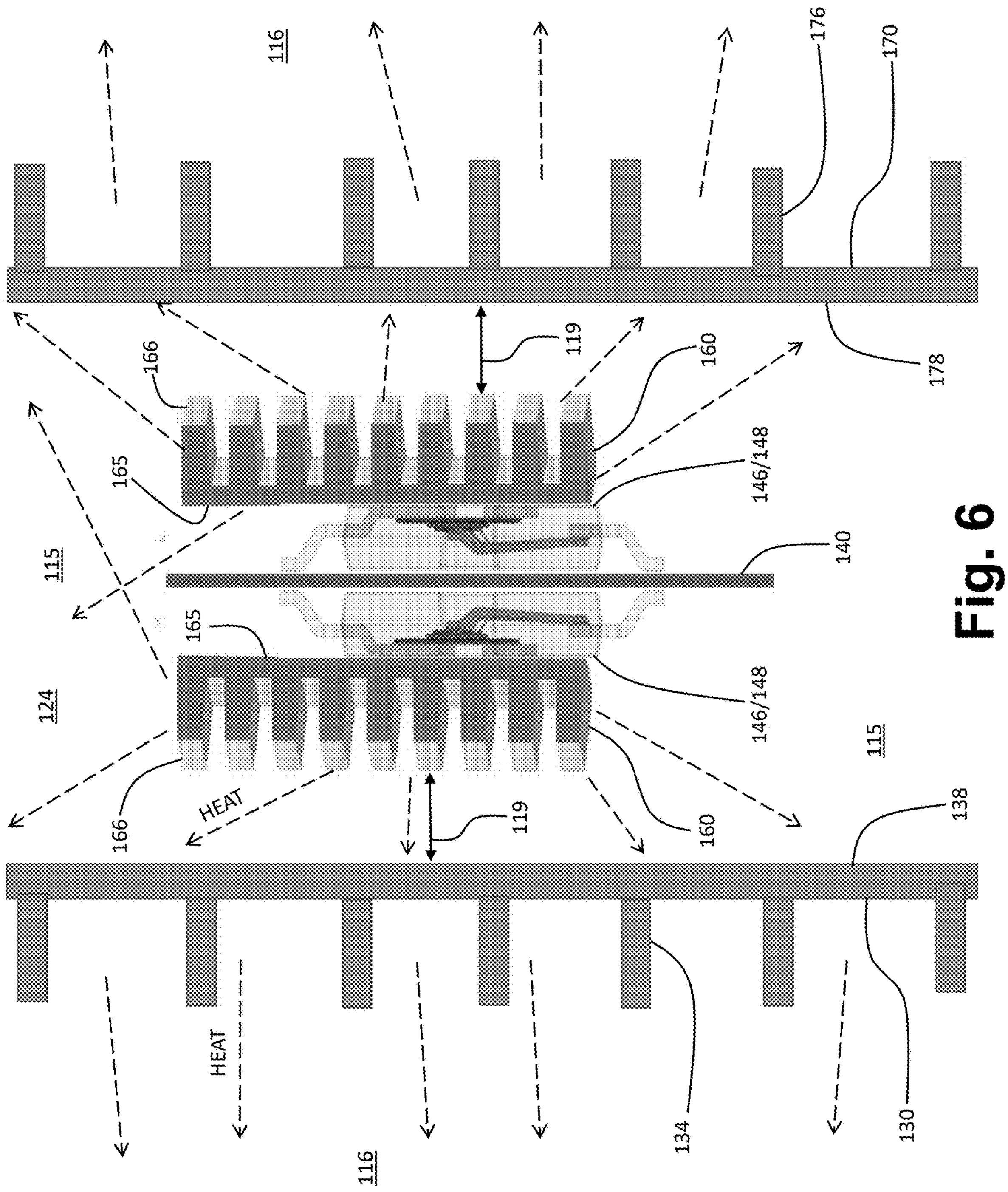
FIG. 6 is a diagram of a wheel controller according to at least one additional embodiment of the present disclosure.

FIG. 6 is a representation of the interior of the lower portion of a wheel controller 120 (which in some embodiments generally correlates to the coolant collection region 124 shown in FIG. 4) showing select interior features according to at least one embodiment of the present disclosure. For another example of where the features represented by FIG. 6 could be generally located in the embodiment depicted in FIGS. 1-5, see FIG. 1. Depicted in FIG. 6 are two heat generating members (integrated circuits) 148, which at least include heat generating circuitry 146 (such as power inverters), connected to the wheel control circuitry 140 (depicted as a printed circuit board (PCB)).

Mounted to each heat generating integrated circuit (IC) 148 is a heat sink 160 according to at least one embodiment of the present disclosure, which increase the effective thermal surface area of the heat generating ICs 148. The boilers 160 (heat sinks 160) depicted in FIG. 6 include an example configuration that is different from the example configurations of the boilers 160 depicted in, for example, FIG. 4. Still other embodiments include heat sinks of different configurations, such as flat plates, which may or may not include fins. The boilers 160 are constructed of materials with high thermal conductivity, such as copper or aluminum. The fins 166 of each boiler 160 increase the total surface area of the boiler 160 while allowing coolant 115 to circulate in and around the fins 166 allowing for greater transfer of heat from each boiler 160 to the coolant 115. The circulating coolant 115, which is heated by the heat generating ICs 148 and the boilers 160, contacts the interior surfaces (for example, interior surfaces 138 and 178) of suspension knuckle 130 and wheel controller cover 170. The suspension knuckle 130 and the wheel controller cover 170 absorb the heat from the coolant 115 and transfer the heat to the ambient air 116, which in some embodiments is enhanced by cooling fins 134 and/or cooling fins 176, respectively. In at least some embodiments, the inner surface 178 of the wheel controller cover 170 and/or the inner surface 138 of the suspension knuckle 130 include fins or pins to increase the surface area of the wheel controller cover 170 and/or the suspension knuckle 130 in contact with the coolant 115. Boilers 160 are helpful in reducing the Leidenfrost effect where vapor forms and the surface of the hot component restricting the ability of the hot component to transfer heat to the liquid coolant 115.

The boilers 160 are sized to transfer large amounts of heat to the coolant 115, although the size of the boilers 160 may be limited by the size of the interior space in the wheel controller 120. For example, in FIG. 6 the boilers 160 extend in directions that are perpendicular to the PCB (wheel control circuitry) 140 toward the interior surfaces of the wheel controller 120 (interior surfaces 178 and/or 138) that are immediately adjacent to the heat generating ICs 148. In some embodiments the boilers 160 span most of the distance between each heat generating integrated circuit (IC) 148 and interior surfaces 178 and 138, leaving a gap 119 between the boilers 160 and the interior surfaces 178 and 138. The gap 119 allows for expansion and contraction of the wheel controller 120 as the temperature of the wheel controller 120 changes. The gap 119 also allows coolant 115 to circulate around the ends of the fins 166 of boilers 160, allowing for efficient heat transfer. In at least one embodiment, the gap 119 is 3 to 4 mm (millimeters).

The boilers 160 may also extend beyond the physical dimensions of the heat generating IC 148 in a direction that is parallel to the PCB (wheel control circuitry) 140. In FIG. 6, each of the boilers 160 extend beyond the edge of the heat generating ICs 148 toward the top of the drawing sheet of FIG. 6. Since boilers 160 are efficient at conducting heat, heat from the heat generating ICs 148 will still be transferred to the upper portions (as depicted in the drawing sheet of FIG. 6) of boilers 160.

Figure 7:
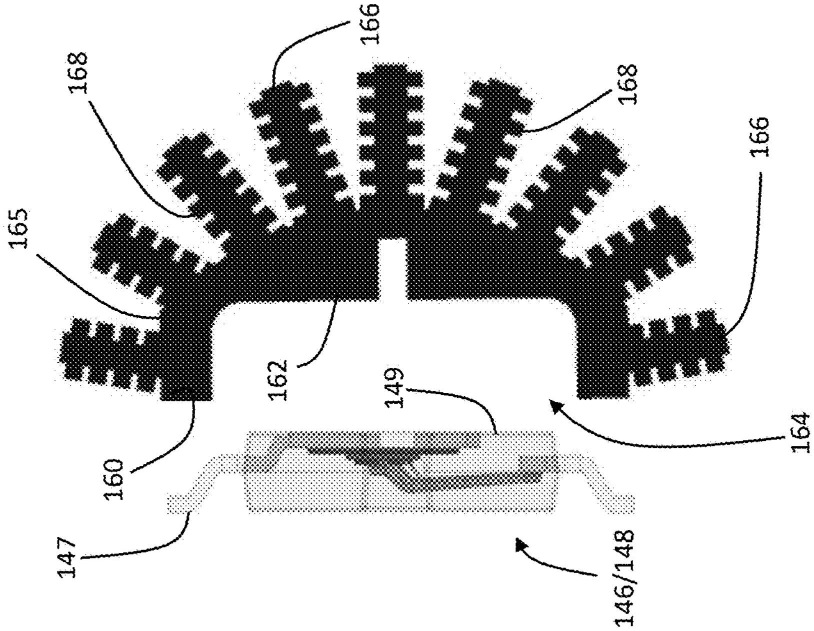
FIG. 7 is an illustration of an electrical integrated circuit and boiler according to at least one embodiment of the present disclosure.

Depicted in FIG. 7 is an example boiler 160 according to at least one embodiment of the present disclosure. The boiler 160 depicted in FIG. 7 includes an example configuration that is different from the example configurations of the boilers 160 depicted in FIGS. 4 and 6, although the features of the specific example boilers can be combined in additional configurations that are not explicitly depicted in the figures. Each of the boilers 160 increases the effective thermal surface area of the heat generating circuitry 146 of the integrated circuits 148 allowing heat to more efficiently transfer from the heat generating circuitry 146 of the integrated circuits 148 to the liquid coolant 115 surrounding the integrated circuits 148.

As shown using the orientation of the boiler 160 and the integrated circuit 148 in FIG. 7, the upper external surface 149 of the integrated circuit 148 (which is the external surface of an integrated circuit 148 that faces away from a circuit board 140 when the integrated circuit 148 is mounted to a circuit board 140) is an external surface on the integrated circuit 148 suitable for mounting a boiler 160. Example integrated circuits 148 utilize pins 147 for connection to a circuit board 140, although some types of circuit boards utilize contact pads in addition to or in place of pins. The boilers 160 are typically constructed of a material with high thermal conductivity, such as copper or aluminum, and each includes an IC connection surface 162 that attaches to the integrated circuit 148.

In some embodiments the surface of the boiler 160 near the IC connection surface 162 is extended beyond the edges of the integrated circuit 148, which further increases the surface area of the boiler 160 that is exposed to the coolant 115. For example, embodiments of the boiler 160 include an IC receptacle 164 that partially surrounds the integrated circuit 148. Further embodiments of the boiler 160 also include features that increase the surface area of the boiler 160 that contacts the liquid coolant 115, such as fins or pins 166, which may in turn include smaller features to further increase the surface area of the boiler, such as secondary fins or pins 168. A thermal interface material, such as a thermal paste, may also be used when connecting a boiler 160 to an integrated circuit 148 to enhance the heat transfer between the integrated circuit 148 and the boiler 160, such as to maximize the physical contact and minimize the air gaps between the integrated circuit 148 and the boiler 160, which is especially beneficial when the boiler 160's IC connection surface 162 is not an exact match for the surface of the integrated circuit 148 to which it is being attached.

Figure 8:
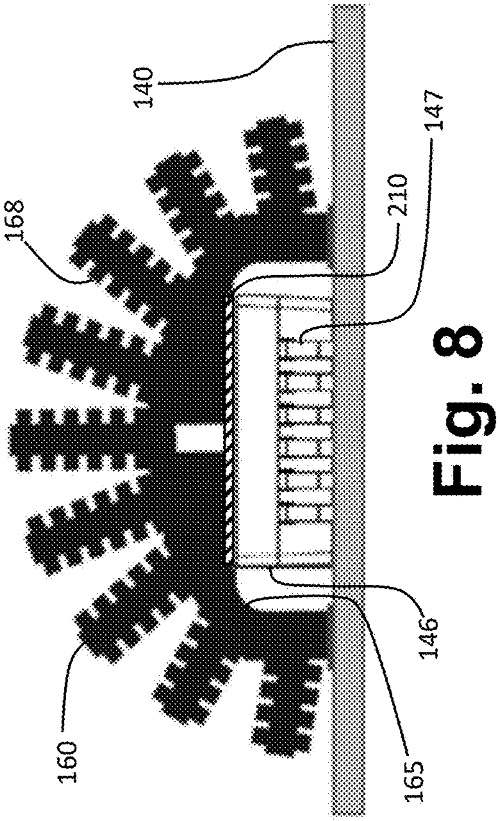
FIG. 8 is an illustration of an electrical integrated circuit mounted to a boiler according to at least one embodiment of the present disclosure.

FIG. 8 depicts the boiler 160 of FIG. 7 connected to a different representation of the heat generating circuitry 146 according to at least one embodiment of the present disclosure. Here a layer of thermal interface material, which is discussed in more detail below, is bonded between the heat generating circuitry 146 and the boiler 160, and the heat generating circuitry 146 is mounted to the wheel control circuitry 140, which is represented as a PCB substrate.

Figure 9:
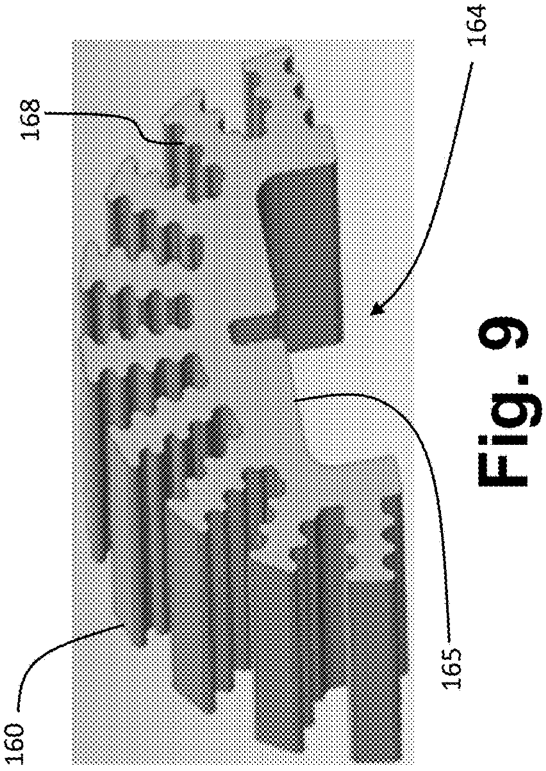
FIG. 9 is an perspective view of a boiler according to at least one embodiment of the present disclosure.

FIG. 9 depicts a perspective view of a boiler 160 according to yet another embodiment of the present disclosure.

Figure 11:
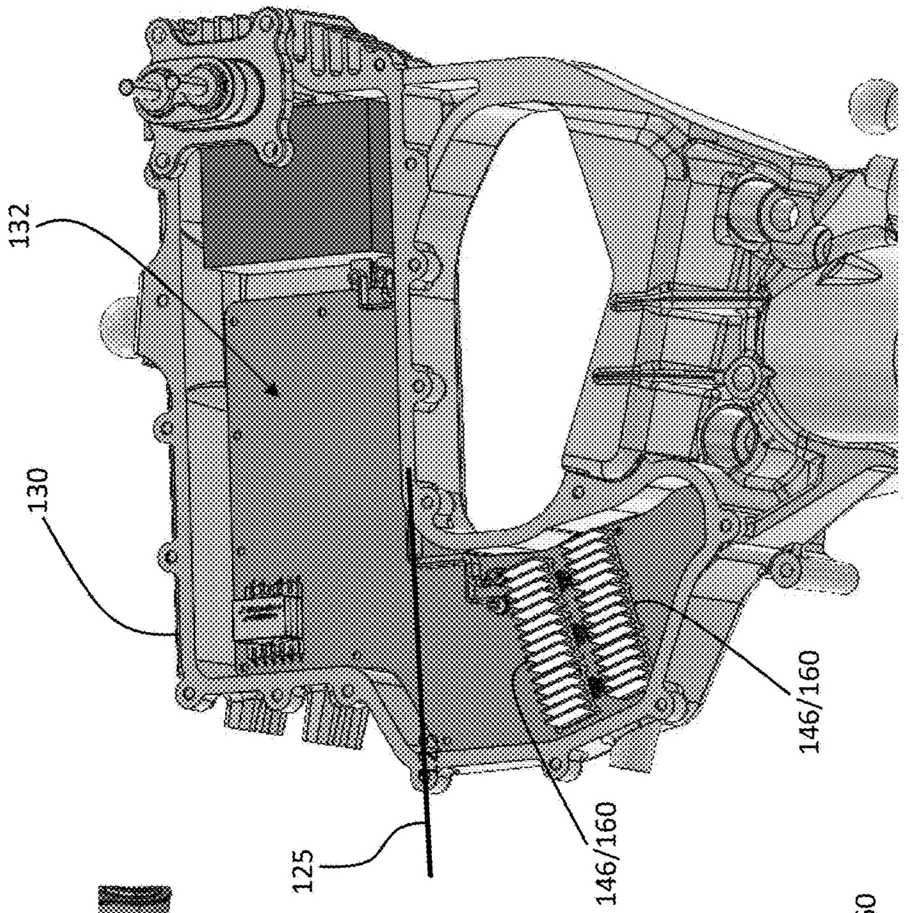
FIG. 11 is a perspective cut-away view of the wheel controller depicted in FIG. 10 viewed from a different perspective.
Figure 10:
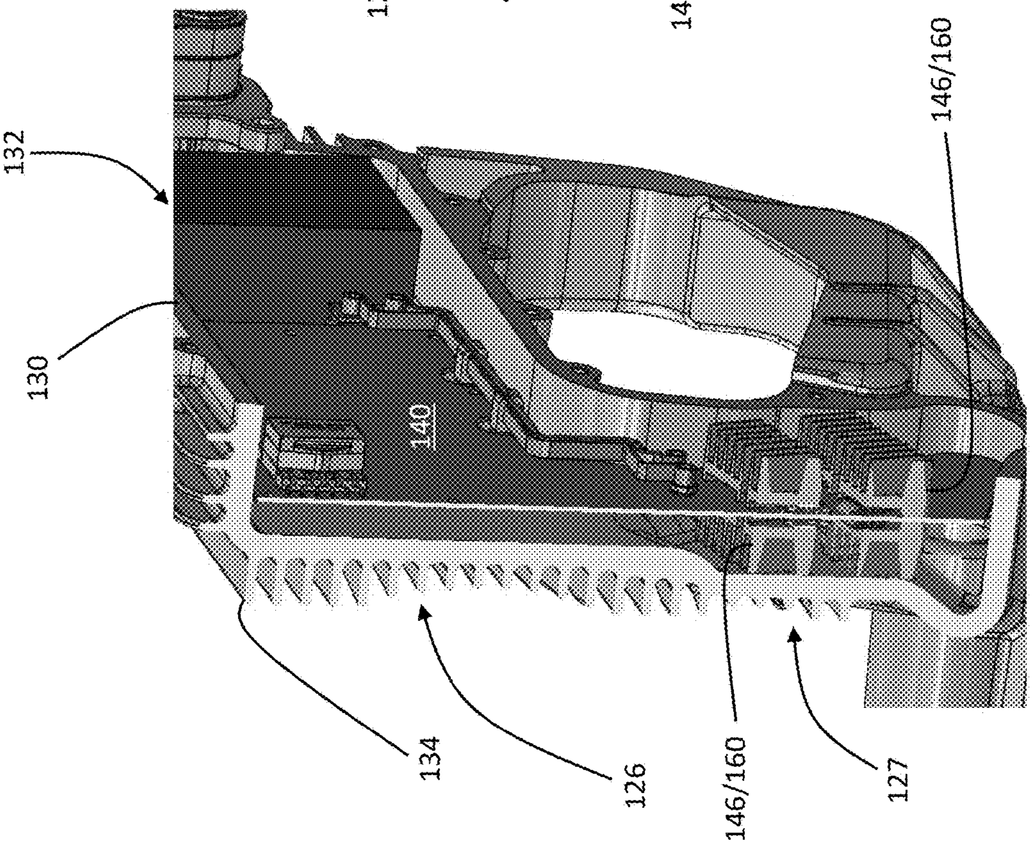
FIG. 10 is a perspective cut-away view of a wheel controller according to at least one additional embodiment of the present disclosure.

FIGS. 10 and 11 include expanded depictions of the upper portion 126 and the lower portion 127 of the wheel control cavity 122 according to additional embodiments of the present disclosure. The configurations of heat generating circuitry 146 and boilers 160 are slightly different than the heat generating circuitry 146 and boilers 160 depicted in the previous figures. FIG. 10 also depicts how in at least some embodiments the heat generating circuitry 146 and boilers 160 can be mounted to both sides of the PCB (wheel control circuitry) 140.

Figure 12:
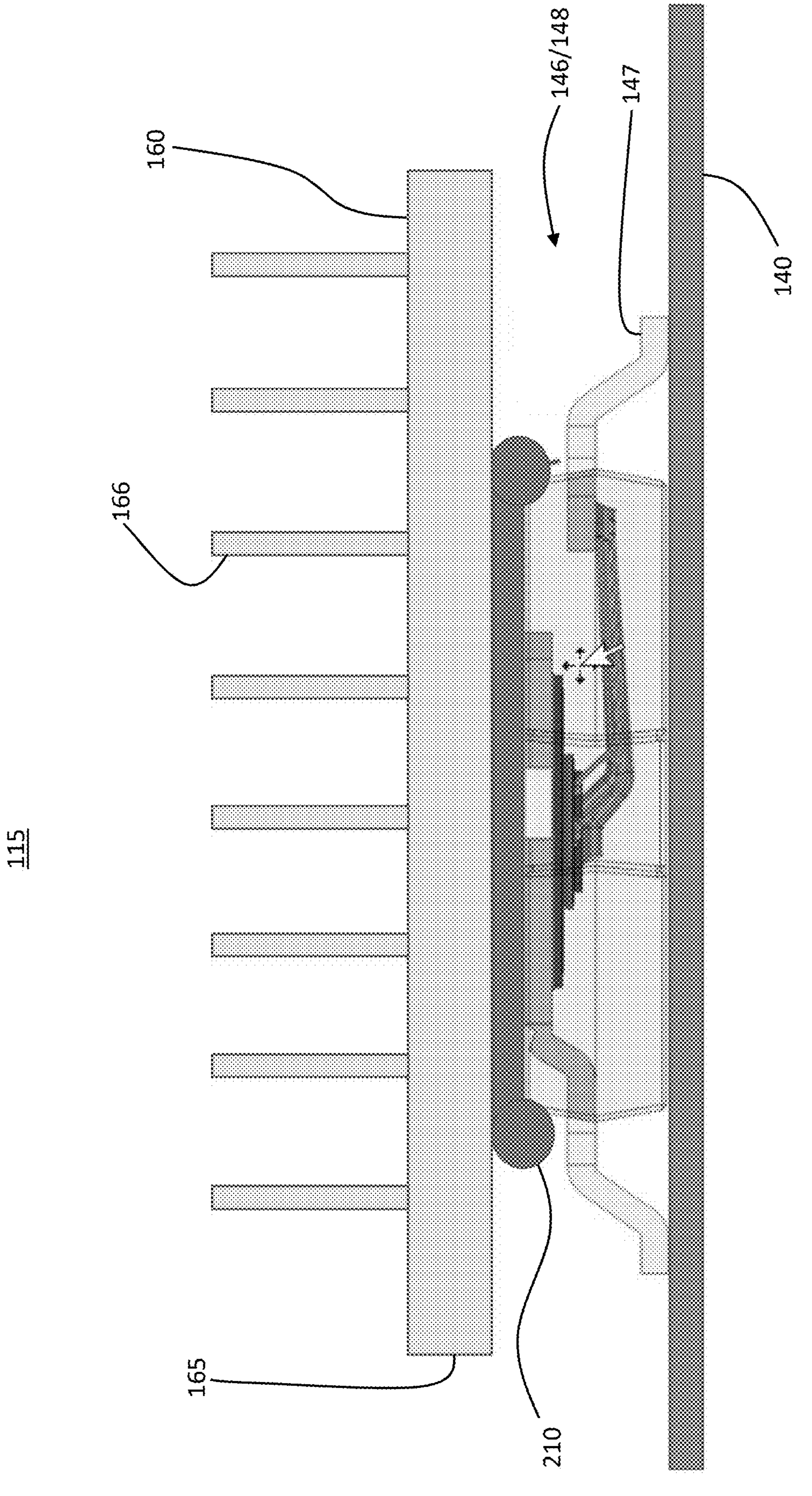
FIG. 12 is an illustration of an integrated circuit mounted to a boiler according to at least one further embodiment of the present disclosure.

Illustrated in FIG. 12 is an expanded view of a connection between the heat generating circuitry 146 of the integrated circuit 148 (which is mounted to the PCB of the wheel controller circuitry 140) and a boiler 160 according to at least one embodiment of the present disclosure. The integrated circuit 148 is mounted to the boiler 160 using a layer, which may be a single layer, of thermal interface material (TIM) 210. When utilizing a coolant 155 that is not electrically conductive, such as a dielectric coolant, the boiler 160 is electrically insulated from the suspension knuckle 130, the wheel control cover 170, and all components in the wheel controller 120 with which the boiler 160 is not in direct physical contact. As such, in some embodiments the boiler 160 is not electrically insulated from the integrated circuit 148. In other words, in some embodiments the boiler 160 is not only thermally connected to the integrated circuit 148, but is also electrically connected to the integrated circuit 148.

Because the boiler 160 can be electrically connected to the integrated circuit 148, the number of methods for connecting the boiler 160 to the integrated circuit 148 is increased, and some embodiments of the present disclosure connect the boiler 160 to the integrated circuit 148 using inexpensive methods such as soldering that can use readily available and inexpensive solder. Although some embodiments utilize thermal interface materials 210 with high thermal conductivity (for example, thermal conductivity of 10-12 Watts per meter Kelvin (W/mK)), other embodiments utilize thermal interface materials with thermal conductivities as low as one-half Watt per meter Kelvin (0.5 W/mK), while some embodiments utilize typical commoditized thermal interface materials with conductivities of 2-4 Watts per meter Kelvin (W/mK). Expensive methods of bonding products, such as those that use multiple layers and/or high cost bonding products, can be avoided in some embodiments. Moreover, while these systems and methods for attaching a heat sink (for example, boiler 160) to an integrated circuit are described in the context of vehicle wheel assemblies, these systems and methods can be utilized for attaching a component (such as a heat sink) to an integrated circuit in other fields where there is a desire to attach a component to an integrated circuit.

Figure 13:
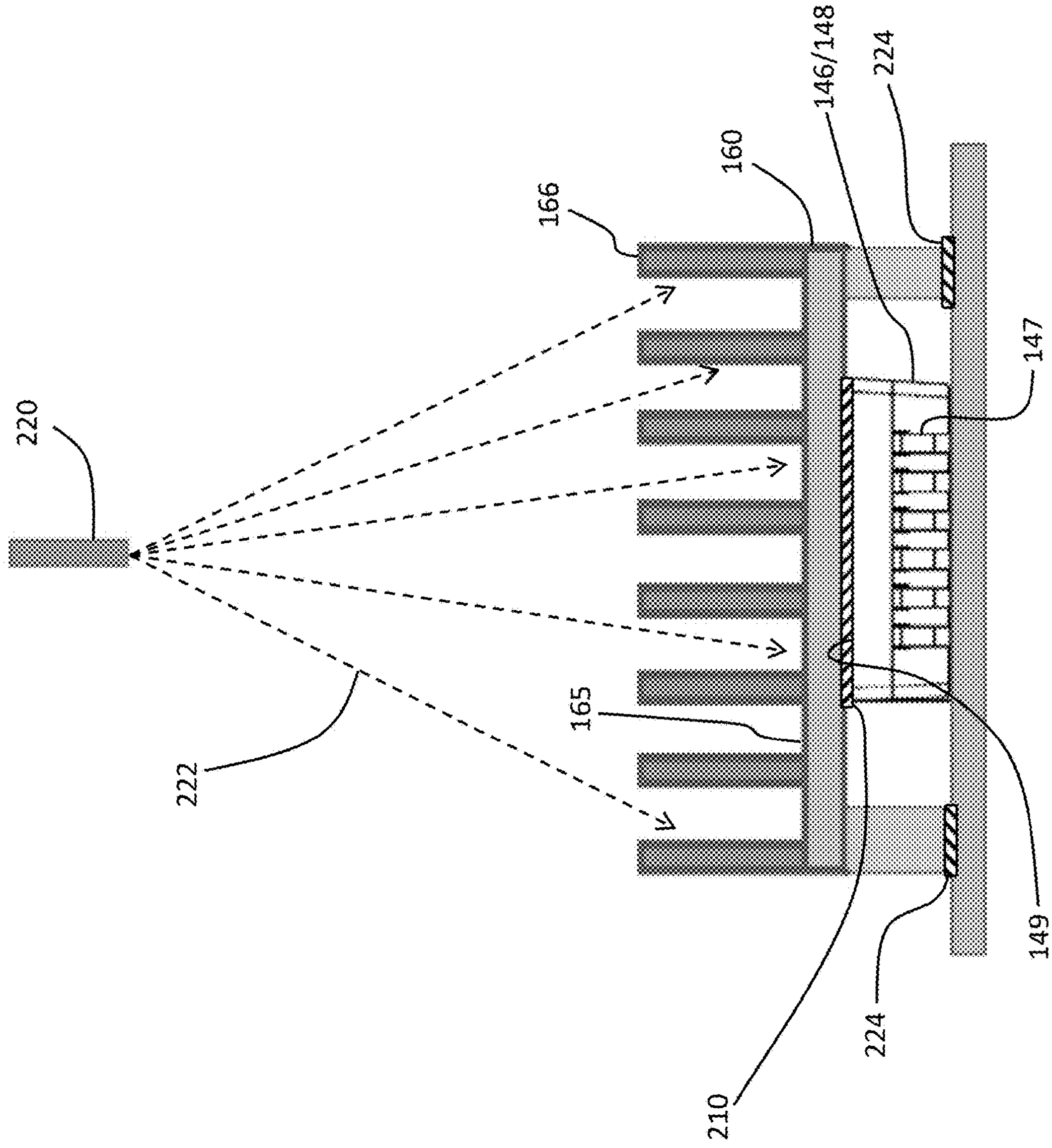
FIG. 13 is an illustration of laser heat conduction bonding a boiler to an integrated circuit according to at least one embodiment of the present disclosure.

For connecting the boiler 160 to the heat generating circuitry of the integrated circuit 148, some embodiments utilize directed laser heating. At least one example is depicted in FIG. 13. In FIG. 13 a laser 220 directs laser beams 222 to a boiler 160. The laser 220 produces laser beams 222 of sufficient intensity to heat the boiler 160, which in turn heats the thermal interface material 210 (which in this example will be referred to as solder 210) and the integrated circuit 148 to sufficient temperatures to have the solder 210 flow and bond the boiler 160 and the integrated circuit 148 together, such as to form an intermetallic bond with the boiler 160 and/or the integrated circuit. By using the laser 220, heat can be applied to precise locations. Although multiple laser beams are depicted in FIG. 13, at least one embodiment the laser 220 emits only one beam at a time. In further embodiments, one or more beams are moved to different locations on the surface of boiler 160. In further embodiments a clamp/vice 230 is used to maintain the boiler 160 in position.

When bonding a component (for example, a boiler 160) to the integrated circuit 148, the solder 210 is positioned between the integrated circuit 148 to which the component will be attached and the component, such as by applying the solder 210 to the surface of the integrated circuit 148 and/or the surface of the component being attached. The surface of the component being attached (for example, boiler 160) may be complimentary to the surface of the integrated circuit 149 to which the component is being mounted, for example, when placed in a position for soldering the surface of the component being attached follows the surface of the integrated circuit to a sufficient extent to allow soldering of the component being attached to the integrated circuit. In some embodiments the surface of the integrated circuit 149 may be planar (such as the upper external surface 149 of the integrated circuit 148) or have planar sections, while in additional embodiments the surface of the integrated circuit 149 may be non-planar (for example, curved or angled) or have non-planar sections. In FIG. 12 the upper external surface 149 of the integrated circuit 148 is the surface of the integrated circuit 148 facing away from the circuit board 140 (and typically facing away from the pins 147 or contact pads) when the integrated circuit 148 is mounted to a circuit board 140. The upper external surface 149 may also be referred to as the upper seal layer of the integrated circuit 148, which can seal the integrated circuit 148 from liquid (for example, water and/or coolant) and other contaminants.

Figure 15:
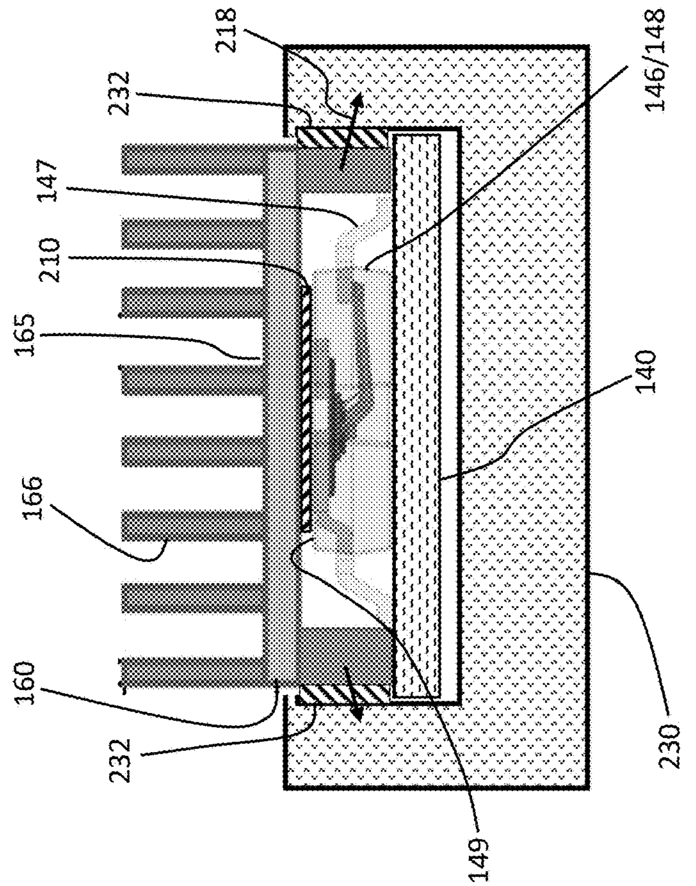
FIG. 15 is an illustration of a claim for use in the laser heat conduction bonding illustrated in FIG. 13 according to at least one additional embodiment of the present disclosure.
Figure 14:
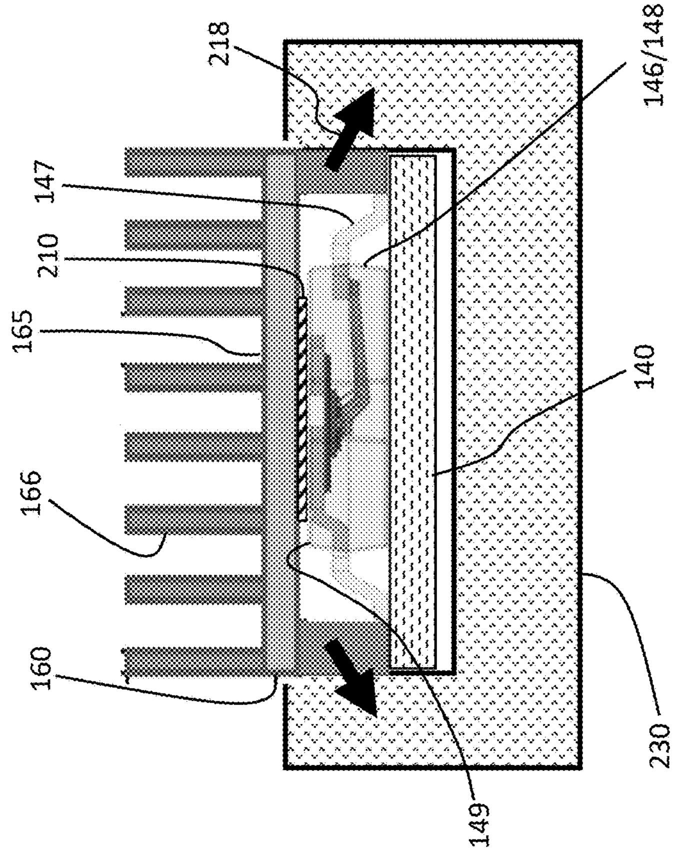
FIG. 14 is an illustration of a clamp for use in the laser heat conduction bonding illustrated in FIG. 13 according to at least one embodiment of the present disclosure.

When the solder 210 reaches the appropriate temperature and flows (melts), the boiler 160 may float on the liquid solder 210, which is on the upper surface of the integrated circuit 148. In some embodiments, an optional adhesive 224 is used to hold the boiler 160 in position on the PCB 140. in some embodiments the adhesive dissipates during the heating process, while in other embodiment the adhesive remains throughout the heating process. In further embodiments a clamp (or vice) 230 is used in place of (or in addition to) the optional adhesive 224. An example clamp 230 is depicted in FIGS. 14 and 15. Depending on how fast clamp 230 absorbs heat, an insulating layer 232 may be used to thermally insulate the clamp 230 from the boiler 160. For example, FIG. 14 depicts a clamp 230 that easily absorbs heat, as represented by the large heat propagation arrows 218. In these situations a higher amount of energy must be imparted to the boiler 160 to compensate for the heat lost to the clamp 230. The higher amount of energy can potentially result in damage to the boiler 160, the heat generating circuitry 146 of the integrated circuit 148, and/or the PCB of the wheel controller circuitry 140. However, when there is a possibility of damaging the boiler 160, circuitry 146/148, and/or PCB 140, an insulating layer 232 can be positioned between the clamp and the boiler 160. When insulating layers 232 are used, a smaller amount of heat will propagate to the clamp 230 and, as shown by the smaller heat propagation arrow 218 in FIG. 15, even when the clamp 230 is constructed of the same heat absorbing material. In at least one embodiment the thermally insulating layer 232 is printed circuit board (PCB) substrate material, which in at least one embodiment is 1.6 mm thick.

Heating the boiler 160 quickly during the manufacturing process can require applying a high power laser to the boiler 160. By controlling the intensity and duration of the heat applied to the boiler 160 by the laser 220, optimal heating profiles can be followed. In some embodiments the optimal heating profiles are non-linear, such as those that utilize ramp-soak-spike profiles where the temperature is ramped to an intermediate temperature and held for a period before being raised to a maximum “spike” temperature then cooled. Alternate embodiments utilize ramp-to-spike profiles where the temperature is ramped to the maximum “spike” temperature then cooled without being held at an intermediate temperature. It was determined by the inventors of the present disclosure that laser heat conduction soldering as disclosed herein can more precisely control the temperatures of the components being heated than traditional techniques. Example advantages of utilizing laser heat conduction soldering as disclosed herein are more precise temperature control and/or a reduction in the tendency for the thermal interface material 210 to splatter, which occurs more readily in other heating methods, such as those using ovens.

Figure 17:
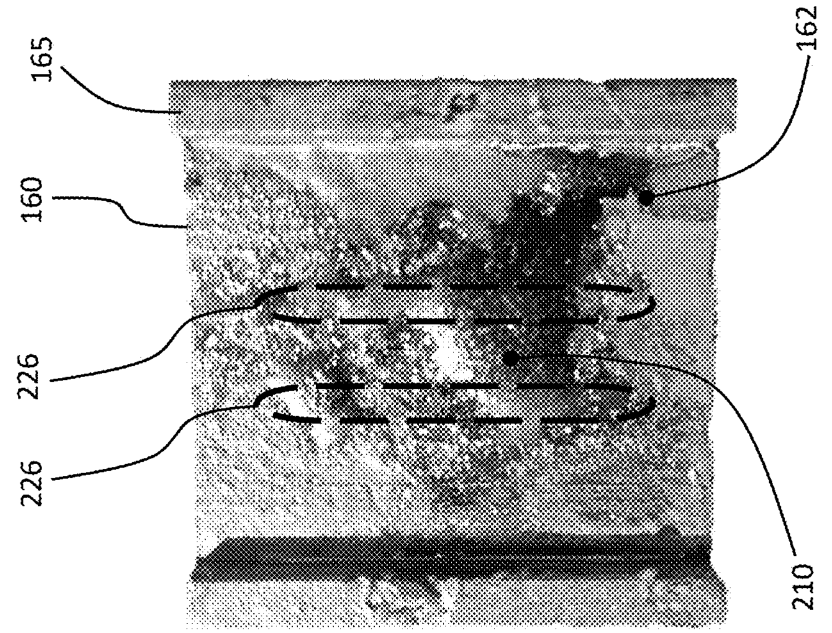
FIG. 17 is a reverse angle perspective view of the boiler illustrated in FIG. 16.
Figure 16:
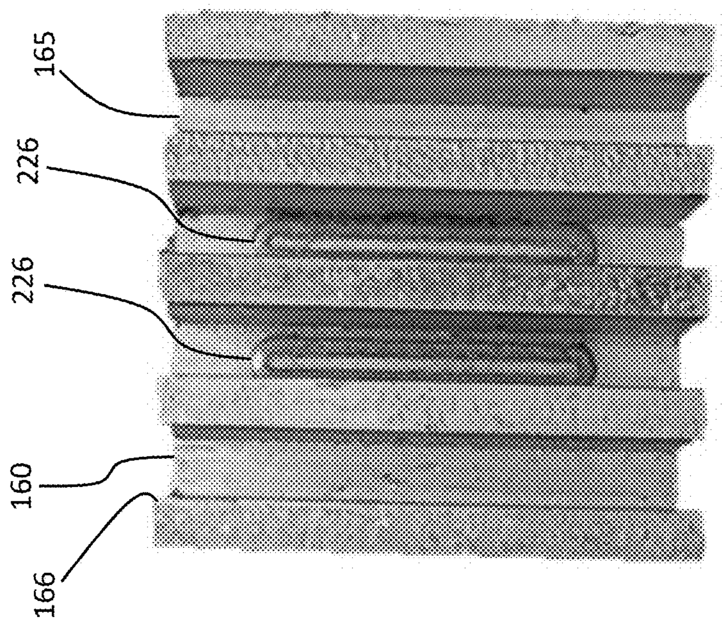
FIG. 16 is a perspective view of a boiler used in the laser heat conduction bonding illustrated in FIG. 13 according to at least one embodiment of the present disclosure.

However, high power lasers can damage the boiler 160, such as if the laser beam is maintained in one location for an extended period (which depending on the power of the laser may occur in one second or less), or can cause splattering or vaporization of the bonding material. As such, some embodiments of the present disclosure heat the boiler 160 by moving a high power laser beam 222 across the surface of the boiler 160. In some embodiments the laser is moved in a back-and-forth motion between the cooling fins 166. In an example depicted in FIGS. 16 and 17 the laser pathway 226 forms a racetrack pattern, although other embodiments utilize different patterns such as a single line (which may be curved, straight or angled, such as a zigzag shape). Each pathway 226 may be formed using an 1800 Watt laser that produces a shaped beam (such as, a ring-shaped beam that, in at least one embodiment, is 640 micrometers (μm) in diameter) that can be moved across the surface of boiler 160 at a steady speed of, for example, 500 mm/sec, or at a speed that varies. In some embodiments with the laser can retrace the laser pathway 226, for example, making ten (10) laps around each racetrack in 1.4 seconds. The result is a thermal interface material (solder) 210 that is sufficiently melted (see, FIG. 17 depicting solder that has been sufficiently heated to flow) while not damaging the boiler 160 and its fins 166 (see, FIG. 16).

By utilizing directed laser heating, embodiments of the present disclosure avoid difficulties associated with other methods of bonding boilers 160 to integrated circuits 148, such as those that utilize ceramics (which are expensive and can be difficult to work with) and/or multiple layers of bonding materials. For example, since the boiler 160 is typically much larger in mass than the integrated circuit 148, difficulties can arise when connecting the boiler 160 to the integrated circuit 148. For instance, if an oven is used to quickly heat both the integrated circuit 148 and the boiler 160 to an appropriate soldering temperature, the temperature of the integrated circuit 148 will exceed the target soldering temperature before the boiler 160 reaches the soldering temperature, which can damage the integrated circuit 148.

Further embodiments of the present disclosure nevertheless use other techniques to bond the boiler 160 to the integrated circuit 148, such as by heating the boiler 160, thermal interface material 210, and the integrated circuit 148 in an oven, which in some embodiments is a reflow oven. When using these techniques the thermal interface material 210 (for example, solder) is placed between the integrated circuit 148 and the boiler 160 and the combined unit is moved through the oven on, for example, a conveyor. Examples of the combined units of thermal interface material 210 placed between the integrated circuit 148 and the boiler 160 are depicted in previously discussed figures. In a reflow oven the temperature applied to the combined unit can be different at different locations as the combined unit is moved through the reflow oven resulting in an appropriate thermal profile for bonding the boiler 160 to the integrated circuit 160. Thermal profiles used in embodiments of the present disclosure include ramp-soak-spike profiles where the temperature is ramped to an intermediate temperature and held for a period before being raised to a maximum "spike" temperature then cooled, or a ramp-to-spike profile where the temperature is ramped to the maximum "spike" temperature then cooled without being held at an intermediate temperature. Techniques for holding the boiler 160 in position with respect to the heat generating circuitry 146 of the integrated circuit 148 utilizing adhesive 224 and/or clamps 230 as described above can also be used with other (for example, more traditional) techniques for bonding the boiler 160 and the integrated circuit 148.

Figure 18:
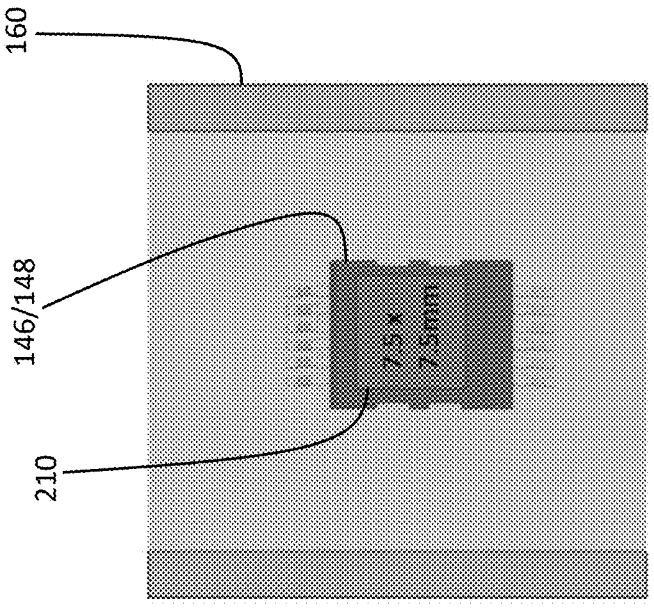
FIG. 18 is a plan view of an integrated circuit, thermal interface material and boiler according to at least one embodiment of the present disclosure.

FIG. 18 is a representation of the heat generating circuitry 146 of the integrated circuit 148 connected to the bottom of a boiler 160 according to at least one embodiment of the present disclosure. The depicted layer of thermal interface material (solder) 210 is a representation of the location of where the solder 210 is placed between the circuitry 146/148 and the boiler 160, although the solder 210 would be hidden from view when viewing an actual device. In this example embodiment the boiler 160 is generally square when viewed from the bottom and is approximately 25 millimeters (mm) wide on each side covering an area of approximately 625 $mm^2$. The heat generating circuitry 146 is approximately 10 mm wide on each side (excluding the connection pins) covering an area of approximately 100 $mm^2$. And, the amount of thermal interface material (solder 210, which when applied may be in the form of a solder paste) is approximately 7.5 mm wide on each side covering an area of approximately 56.25 $mm^2$.

Figure 19:
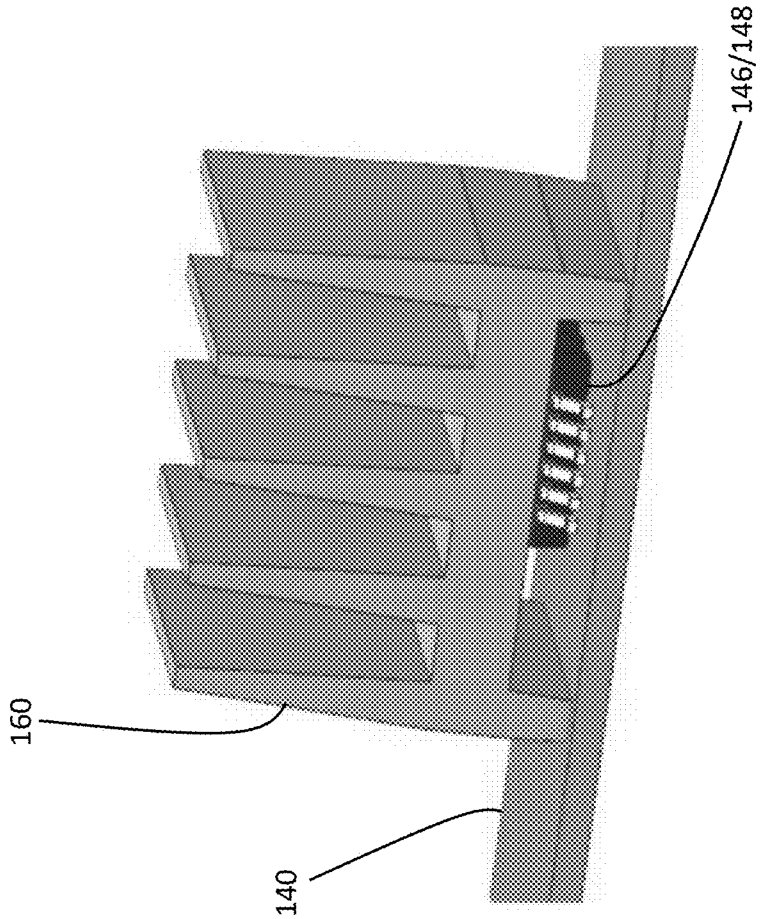
FIG. 19 is a perspective view of an integrated circuit, boiler and substrate according to at least one embodiment of the present disclosure.

Depicted in FIG. 19 is heat generating circuitry 146 of the integrated circuit 148 connected to a heat sink, for example, a boiler 160, and the PCB of the wheel controller circuitry 140 according to at least one additional embodiment of the present disclosure. Here the fin design of the boiler 160 is different from other embodiments disclosed herein.

To assemble the wheel controller 120, all of the components of the wheel controller 120 may be connected to one another. For example, the wheel control circuitry bus bar 142, the battery bus bar 144, the capacitor 152 and the electrical filter 154 may be connected to the wheel control cover 170. The wheel control circuitry 140, which includes the integrated circuit 148 and the heat generating circuitry 146, will also be connected to the wheel control cover 170, such as by using fasteners 133 (see, for example, FIG. 4). Once assembled, the wheel control cover 170 may then be connected to the suspension knuckle 130 using, for example, fasteners similar to fasteners 113 and placing the optional gasket 174 between the suspension knuckle 130 and the wheel control cover 170. Coolant 115 may then be added to the assembled wheel controller 120, such as through a coolant port that can be sealed after the fluid has been added. In the illustrated embodiment the aperture 179 (see, FIG. 3A) for receiving the high voltage pass-through assembly 184 may be used as a coolant port, which will be sealed when the high voltage pass-through assembly 184 is connected to the wheel control cover 170. The wheel controller cavity 122 can then be filled with coolant 115 to a level where the heat generating circuitry 146 will be submerged when the wheel controller 120 is connected to the vehicle. The high voltage pass-through assembly 182 may then be connected to the wheel control cover 170, although this step may accomplished at a different time, such as before the wheel control cover 170 is connected to the wheel control circuitry 140.

In alternate embodiments, the wheel control circuitry 140, which includes the integrated circuit 148 and the heat generating circuitry 146, may be connected directly to the suspension knuckle 130 prior to the wheel control cover 170 being attached to the suspension knuckle 130.

Figure 20:
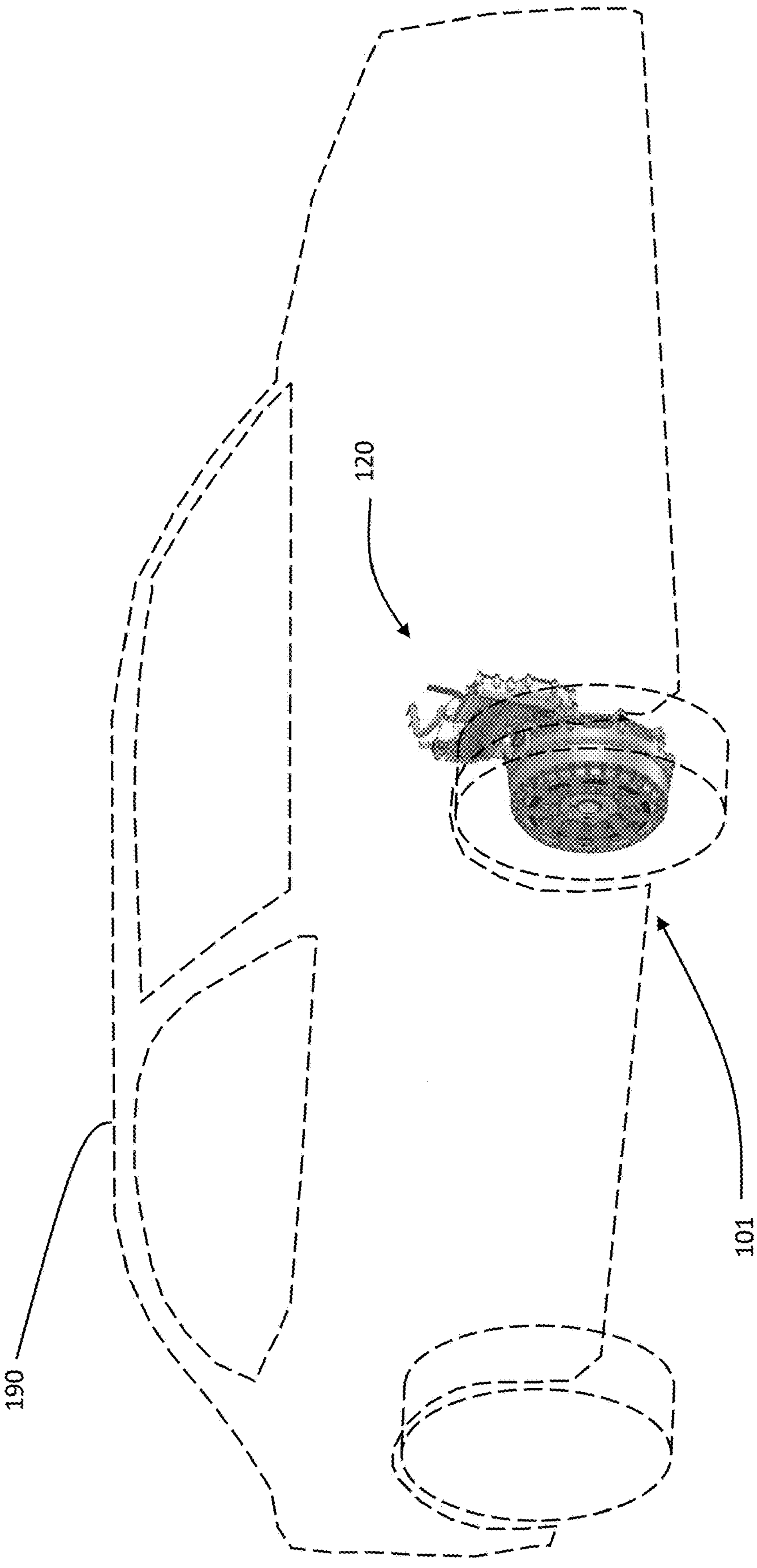
FIG. 20 is a perspective view of the wheel controller and wheel assembly of FIG. 1 mounted to a vehicle.

FIG. 20 illustrates a vehicle 190 incorporating the wheel controller 120 and wheel assembly 101 according to at least one embodiment of the present disclosure. The vehicle 190 is depicted as transparent to allow for easy viewing of the wheel controller 120 and wheel assembly 101. Moreover, while the outline of vehicle 120 may resemble a passenger vehicle, vehicle 120 is not so limited and may be any other type of wheeled vehicle that may operate on land, in the water, or in the air, and may include one or more tracks around the wheel.

When the wheel controller 120 is installed on a vehicle as shown in FIG. 20, the bottom portions the wheel controller 120 as depicted in FIGS. 1-5 (for example, the lower portion 127 of the wheel controller cavity 122) are gravitationally below the upper portions of the wheel controller 120 (for example, the upper portion 126 of the wheel controller cavity 122).

In use, the wheel control circuitry 140 is supplied power by the power cords 111 and the high voltage pass-through assembly 182. The wheel control circuitry 140 controls the operation of the wheel assembly 101, and thereby controls the operation of the wheel bearing 105, the rim 104, and the tire 103. For example, the wheel control circuitry 140 controls the tire 103 to rotate faster when the driver desires to have the vehicle move faster (accelerate), and can control the tire's rotation to slow when the driver desires to have the vehicle slow down (decelerate). In vehicles with regenerative braking systems, the wheel control circuitry 140 can also control the charging of the vehicle's battery when the driver desires to have the vehicle slow down.

Heat is generated by the wheel control circuitry 140 as the wheel control circuitry operates, with most of the heat being generated by certain components, which are generally referred as the heat generating circuitry 146 and which function as heaters for the coolant 115 contained within the wheel controller 120. The coolant 115 does not electrically interact with the wheel control circuitry 140. In some embodiments the coolant 115 is a dielectric fluid, and in some embodiments the dielectric fluid has a boiling point that is below the operating temperature of the heaters (for example, a boiling point from 30° C. to 110° C.) resulting in the coolant 115 converting to a gas and/or vapor at temperatures below the maximum operating temperature for the wheel control circuitry, such as below the maximum operating temperature for the heat generating circuitry 146. In other embodiments the coolant 115 has a boiling point that is above the operating temperature of the heaters (for example, a boiling point above 110° C.) resulting in the coolant 115 remaining a liquid at temperatures above the maximum operating temperature for the wheel control circuitry, such as above the maximum operating temperature for the heat generating circuitry 146.

The heat generating circuitry 146 typically includes the electrical switching components (FETs for example) for the wheel assembly 1 20. As the heat in the heat generating circuitry 146 increases, the liquid coolant 115 absorbs the heat from the heat generating circuitry 146 and the temperature of the liquid coolant 115 increases. In embodiments where the boiling point of the coolant 115 is below the operating temperature of the heat generating circuitry 146, the amount of coolant 115 in the wheel controller cavity 122 that is in a gaseous or vapor form increases as the temperature of the liquid coolant 115 increases. In embodiments where the boiling point of the coolant 115 is above the operating temperature of the heat generating circuitry 146, the coolant 115 in the wheel controller cavity 122 remains primarily in the liquid form.

In embodiments where the coolant 115 transitions from liquid to vapor and/or gas, the transition of the coolant 115 from liquid to gas or vapor carries heat away from the liquid coolant 115 allowing the liquid coolant 115 to absorb more heat from the heat generating circuitry 146. The liquid coolant 115 remains in the lower portion 127 of the wheel controller cavity 122 while the coolant 115 that is in a gaseous and/or vapor state moves to the upper portion 126 of the wheel controller cavity 122. In the upper portion 126 of the wheel controller cavity 122 the gaseous and/or vapor coolant 115 contacts surfaces of the wheel controller 120 that are cooler than the coolant 115, which result in the coolant 115 condensing on and transferring heat to these cooler surfaces.

The surfaces of the wheel controller 120 in the upper portion 126 of wheel controller 120 transfer the heat they receive from the coolant 115 to the environment external to the wheel controller 120. The cooled coolant 115 then moves downward toward the lower portion 127 of the wheel controller cavity 122 since it is less dense than the warmer coolant 115. In embodiments where gaseous and/or vapor coolant 115 is cooled, the condensed coolant 115 moves (for example, drips) back to the lower portion 127 of the wheel controller cavity 122, such as by gravity.

The wheel controller 120 with its liquid cooling system effectively increases the surface area being used to transfer heat from the heat generating circuitry 146 to the environment external to the wheel controller 120. Embodiments where a significant portion of the cooling is performed by the coolant 115 transitioning from liquid to gas (and/or vapor) and back to liquid are frequently referred to as two-phase immersion cooling embodiments, while embodiments where a significant portion of the cooling is performed by coolant 115 that remains in the liquid state are frequently referred to as single-phase immersion cooling embodiments.

In some embodiments of the present disclosure the surface area of the heat generating circuitry 146 is effectively expanded 200:1 or greater, and in some embodiments the heat generating circuitry 146 is effectively expanded 1000:1. In the embodiment depicted in FIGS. 1-5, the heat generating circuitry 146 is effectively expanded 540:1.

The optional cooling fins 134 and 176 of the wheel controller 120 increase the ability of the wheel controller 120 to dissipate the heat received by the coolant 115 to the environment external to the wheel controller 120 (via the housing), which is typically the ambient air 116 surrounding the vehicle to which the wheel controller 120 is attached. The fins effectively increase the surface area on the external surface of the wheel controller 120 increasing the amount of heat that can be dissipated to the external environment. As depicted in FIGS. 3 and 5, embodiments of the present disclosure maximize the amount of wheel controller 120's external surface area covered by cooling fins. Cooling fins 134 and 176 that are adjacent to the lower portion 127 of the wheel controller cavity 127 transfer heat from the coolant 115 that is in a liquid state. In two-phase immersion cooling embodiments the cooling fins 134 and 176 that are adjacent to the upper portion 126 of the wheel controller cavity 127 transfer heat from the coolant 115 that is in a gaseous and/or vapor form, while in single-phase immersion cooling embodiments the cooling fins 134 and 176 that are adjacent to the upper portion 126 of the wheel controller cavity 127 transfer heat from the coolant 115 that is in liquid form. The cooling fins 134 and 176 can be configured to increase (and ideally maximize) the amount of air 116 flowing over their surfaces taking into account the airflow caused by the moving vehicle and the spinning tire.

While the wheel controller cavity 122 is depicted FIGS. 1-5 as being formed between two components (for example, the suspension knuckle 130 and the wheel controller cover 170), other embodiments include wheel controller cavities that are formed in an internal space formed in one component (for example, the suspension knuckle 130) that is sealed to prevent escape of coolant 115 as the wheel control circuitry becomes hot.

Moreover, while the suspension knuckle 130 has been described as forming part of the wheel controller cavity 122, other embodiments include wheel controllers with a wheel controller cavity formed without using portions of the suspension knuckle and connecting the structure that forms the wheel controller cavity to the suspension knuckle.

Reference systems that may be used herein can refer generally to various directions (for example, upper, lower, forward, rearward, width, depth and/or height), which are merely offered to assist the reader in understanding the various embodiments of the disclosure and are not to be interpreted as limiting.

To clarify the use of and to hereby provide notice to the public, the phrases "at least one of A, B, . . . and N" or "at least one of A, B, . . . N, or combinations thereof" or "A, B, . . . and/or N" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. As one example, “A, B and/or C” indicates that all of the following are contemplated: “A alone,” “B alone,” “C alone,” “A and B together,” “A and C together,” “B and C together,” and “A, B and C together.” If the order of the items matters, then the term “and/or” combines items that can be taken separately or together in any order. For example, “A, B and/or C” indicates that all of the following are contemplated: “A alone,” “B alone,” “C alone,” “A and B together,” “B and A together,” “A and C together,” “C and A together,” “B and C together,” “C and B together,” “A, B and C together,” “A, C and B together,” “B, A and C together,” “B, C and A together,” “C, A and B together,” and “C, B and A together.”

While examples, one or more representative embodiments and specific forms of the disclosure have been illustrated and described in detail in the drawings and foregoing description, the same is to be considered as illustrative and not restrictive or limiting. The description of particular features in one embodiment does not imply that those particular features are necessarily limited to that one embodiment. Some or all of the features of one embodiment can be used or applied in combination with some or all of the features of other embodiments unless otherwise indicated. One or more exemplary embodiments have been shown and described, and all changes and modifications that come within the spirit of the disclosure are desired to be protected.

Element Numbering

Table 1 includes element numbers and at least one word used to describe the element and/or feature represented by the element number. However, none of the embodiments disclosed herein are limited to these descriptions. Other words may be used in the description or claims to describe a similar member and/or feature, and these element numbers can be described by other words that would be understood by a person of ordinary skill reading and reviewing this disclosure in its entirety.

TABLE 1

| | |
|---|---|
| 101 | Wheel assembly |
| 103 | Tire |
| 104 | Rim |
| 105 | Wheel bearing |
| 107 | Motor position sensor assembly |
| 109 | Motor interconnect assembly |
| 111 | Power cords |
| 113 | Fasteners |
| 115 | Coolant |
| 116 | Air |
| 117 | Wheel controller housing |
| 118 | Wheel controller cavity height |
| 119 | Gap (distance) |
| 120 | Wheel controller |
| 121 | Wheel controller cavity width |
| 122 | Wheel controller cavity |
| 123 | Wheel controller cavity depth |
| 124 | Coolant collection region |
| 125 | Liquid coolant level |
| 126 | Upper portion of wheel controller cavity |
| 127 | Lower portion of wheel controller cavity |
| 128 | Upper portion width |
| 129 | Lower portion width |
| 130 | Suspension knuckle |
| 131 | Hub |
| 132 | Hollow |
| 133 | Spindle |

TABLE 1-continued

| | |
|---|---|
| 134 | Cooling fins |
| 136 | Ball joint |
| 138 | Interior surface |
| 140 | Wheel control circuitry |
| 142 | Wheel control circuitry bus bar |
| 144 | Battery bus bar |
| 146 | Heat generating circuitry |
| 147 | Pins |
| 148 | Integrated circuit (IC) |
| 149 | Upper external surface |
| 152 | Capacitor |
| 154 | Electrical filter |
| 160 | Boiler |
| 162 | IC connection surface |
| 164 | IC receptacle |
| 166 | Cooling fin (or pin) |
| 170 | Wheel controller cover |
| 172 | Wheel control circuitry connectors |
| 174 | Gasket |
| 176 | Cooling fins |
| 178 | Interior surface |
| 179 | Aperture |
| 182 | High voltage pass-through assembly |
| 190 | Vehicle |
| 210 | Thermal interface material |
| 218 | Heat propagation direction |
| 220 | Laser |
| 222 | Laser beam |
| 224 | Adhesive |
| 226 | Laser pathway |
| 230 | Clamp/vice |
| 232 | Thermal insulation |

What is claimed is:

1. An apparatus for a vehicle, comprising:

a vehicle suspension member defining a fluid tight cavity and a coolant port, the vehicle suspension member forming a load bearing component of a suspension system that connects a vehicle body to one or more wheels, the fluid tight cavity configured to hold coolant and defining an interior surface, and the coolant port configured to permit movement of coolant through the coolant port when unsealed and configured to inhibit movement of coolant through the coolant port when sealed; and a heat generating member mounted within the fluid tight cavity, wherein during operation the heat generating member is submerged in liquid coolant held within the fluid tight cavity, the heat generating member raises the temperature of the liquid coolant until at least some of the liquid coolant transitions to a vapor and/or a gas, the vapor and/or gas coolant condenses on the interior surface of the fluid tight cavity, and the condensed coolant collects in the fluid tight cavity adjacent to the heat generating member.

2. The apparatus of claim 1, wherein the vehicle suspension member is a suspension knuckle defining a wheel connection member including a wheel hub or a wheel spindle, and a suspension system connection member configured to attach to a vehicle suspension system.

3. The apparatus of claim 1, wherein the vehicle suspension member includes an exterior surface defining one or more cooling fins.

4. The apparatus of claim 1, wherein the heat generating member is an electrical circuit.

5. The apparatus of claim 4, wherein the electrical circuit includes at least one power inverter.

6. The apparatus of claim 5, wherein the power inverter is configured to power an electric wheel assembly of an electric vehicle.

7. The apparatus of claim 4, further comprising:
a heat conducting boiler thermally connected to the electrical circuit and defining one or more cooling fins.

8. The apparatus of claim 7, wherein the heat conducting boiler is electrically connected to the electrical circuit.

9. The apparatus of claim 7, wherein the electrical circuit is connected to a printed circuit board mounted within the fluid tight cavity.

10. The apparatus of claim 7, wherein the electrical circuit is connected to the suspension member.

11. The apparatus of claim 1, wherein the fluid tight cavity holds liquid dielectric coolant, wherein the heat generating member is submerged in the liquid dielectric coolant.

12. A wheel controller for an electric vehicle, the electric vehicle including a vehicle suspension system, comprising:
a suspension knuckle defining a first mounting location and a second mounting location, the first mounting location configured to mount to an electric wheel assembly and the second mounting location configured to mount to a vehicle suspension system, wherein the suspension knuckle forms a structural part of the vehicle suspension system when the first mounting location is mounted to an electric wheel assembly and the second mounting location is mounted to the vehicle suspension system;
a cover connected to the suspension knuckle, wherein the cover and suspension knuckle define a fluid tight cavity when the cover and the suspension knuckle are connected to one another, the fluid tight cavity defining a fluid collection region in which coolant is held, wherein the fluid tight cavity is configured to hold coolant within the fluid tight cavity when the coolant is heated; and
wheel control circuitry configured to control the functioning of an electric wheel assembly to which the suspension knuckle is attached, the wheel control circuitry including one or more heat generating components that generate heat while operating, wherein the one or more heat generating components are positioned within the fluid collection region of the fluid tight cavity.

13. The wheel controller of claim 12, wherein the fluid tight cavity includes an upper portion above the fluid collection region, wherein during operation the coolant that is heated by the one or more heat generating components into a gas and/or vapor condenses to liquid form on the surfaces of the upper portion and moves in liquid form to the fluid collection region.

14. The wheel controller of claim 13, wherein upper portion defines an upper portion volume and the fluid collection region defines a fluid collection region volume, and the upper portion volume is greater than the fluid collection region volume.

15. The wheel controller of claim 13, wherein
the upper portion of the fluid tight cavity defines an upper portion depth between the suspension knuckle and the cover, the fluid collection region of the fluid tight cavity defines a fluid collection region depth between the suspension knuckle and the cover, and the upper portion depth is equal to the fluid collection region depth; and
the upper portion of the fluid tight cavity defines an upper portion width perpendicular to the upper portion depth, the fluid collection region of the fluid tight cavity defines a fluid collection region width, and the upper portion width is greater than the fluid collection region width.

16. The wheel controller of claim 13, wherein the condensed coolant moves by gravity from the upper portion of the fluid tight cavity to the fluid collection region.

17. The wheel controller of claim 12, wherein the suspension knuckle defines a plurality of cooling fins located on the external surface of the suspension knuckle.

18. The wheel controller of claim 12, wherein the cover defines a plurality of cooling fins located on the external surface of the cover.

19. The wheel controller of claim 18, wherein the suspension knuckle defines a plurality of cooling fins located on the external surface of the suspension knuckle.

20. A wheel controller for an electric vehicle, the electric vehicle including a vehicle suspension system, comprising:
a suspension knuckle defining a first mounting location and a second mounting location, the first mounting location configured to mount to an electric wheel assembly and the second mounting location configured to mount to a vehicle suspension system, wherein the suspension knuckle forms part of the vehicle suspension system when the first mounting location is mounted to an electric wheel assembly and the second mounting location is mounted to the vehicle suspension system;
a cover connected to the suspension knuckle;
wheel control circuitry connected to the suspension knuckle and configured to control the functioning of an electric wheel assembly to which the suspension knuckle is attached, the wheel control circuitry including heat generating components that generate heat while operating; and
means for cooling the heat generating components.

* * * * *